US009460238B2

(12) United States Patent
Hankey et al.

(10) Patent No.: US 9,460,238 B2
(45) Date of Patent: Oct. 4, 2016

(54) METHODOLOGY FOR DETERMINING AN IMPROVED FORM OF HEADPHONES

(71) Applicant: Apple Inc., Cupertino, CA (US)

(72) Inventors: M. Evans Hankey, San Francisco, CA (US); Jonathan S. Aase, Redwood City, CA (US); Matthew D. Rohrbach, San Francisco, CA (US); Daniele G. De Iuliis, San Francisco, CA (US); Kristi E. Bauerly, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 345 days.

(21) Appl. No.: 13/826,272

(22) Filed: Mar. 14, 2013

(65) Prior Publication Data

US 2014/0072140 A1     Mar. 13, 2014

Related U.S. Application Data

(60) Provisional application No. 61/699,767, filed on Sep. 11, 2012.

(51) Int. Cl.
| | | |
|---|---|---|
| *G06F 17/50* | (2006.01) | |
| *H04R 25/00* | (2006.01) | |
| *H04R 1/10* | (2006.01) | |

(52) U.S. Cl.
CPC .............. *G06F 17/50* (2013.01); *H04R 1/1058* (2013.01); *H04R 1/1016* (2013.01); *H04R 25/652* (2013.01); *H04R 25/658* (2013.01); *H04R 2460/11* (2013.01)

(58) Field of Classification Search
CPC .. H04R 1/1058; H04R 1/1016; H04R 25/65; H04R 25/652; H04R 25/656; H04R 25/658; H04R 2225/77; H04R 2460/11; G06F 17/50; G06F 17/5009; G06F 17/5018; G06F 17/5022; B29C 33/3835; A61F 11/06; A61F 11/08

USPC .................. 29/594; 703/1; 700/98; 345/589
See application file for complete search history.

(56) References Cited

U.S. PATENT DOCUMENTS

| | | | | |
|---|---|---|---|---|
| 7,813,591 | B2 * | 10/2010 | Paley et al. ................... | 382/285 |
| 8,086,427 | B2 * | 12/2011 | Fang .................... | H04R 25/652 |
| | | | | 345/419 |
| 8,150,542 | B2 * | 4/2012 | Roth et al. ..................... | 700/118 |
| 8,229,180 | B2 * | 7/2012 | Baloch ............... | G06K 9/00201 |
| | | | | 345/420 |
| 2004/0107080 | A1 * | 6/2004 | Deichmann ............. | A61F 11/08 |
| | | | | 703/6 |
| 2005/0088435 | A1 * | 4/2005 | Geng .................... | G06T 7/0022 |
| | | | | 345/419 |
| 2009/0063107 | A1 * | 3/2009 | Saltykov .............. | H04R 25/652 |
| | | | | 703/2 |
| 2010/0217417 | A1 * | 8/2010 | Zouhar et al. .................. | 700/98 |
| 2010/0318208 | A1 * | 12/2010 | Schiller et al. ................. | 700/98 |
| 2014/0343900 | A1 * | 11/2014 | Goldstein et al. ................ | 703/1 |

\* cited by examiner

*Primary Examiner* — Vivian Chin
*Assistant Examiner* — Jason R Kurr
(74) *Attorney, Agent, or Firm* — Van Court & Aldridge LLP

(57) ABSTRACT

A method for determining a form for a headphone part using a representative model includes receiving data for at least one ear model. The ear model may be oriented within a coordinate system based on the data, where orienting is focused on the alignment with respect to one or more areas of the ear. A representative model is determined from a plurality of oriented ear models, where the representative model is a representation for a volume determined to be common to at least two oriented ear models. The size and/or shape for the headphone part is determined based upon the representative model.

17 Claims, 20 Drawing Sheets
(8 of 20 Drawing Sheet(s) Filed in Color)

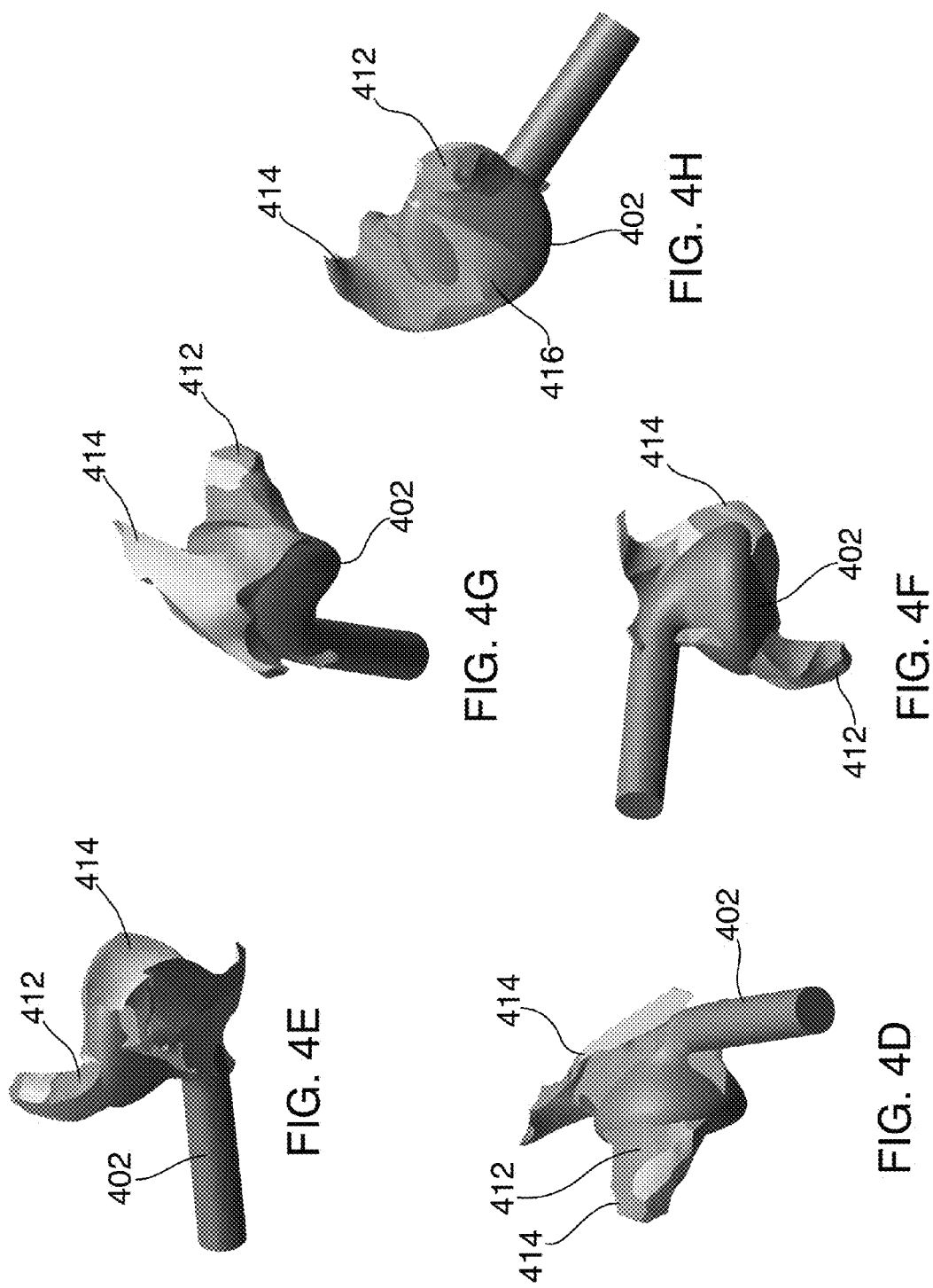

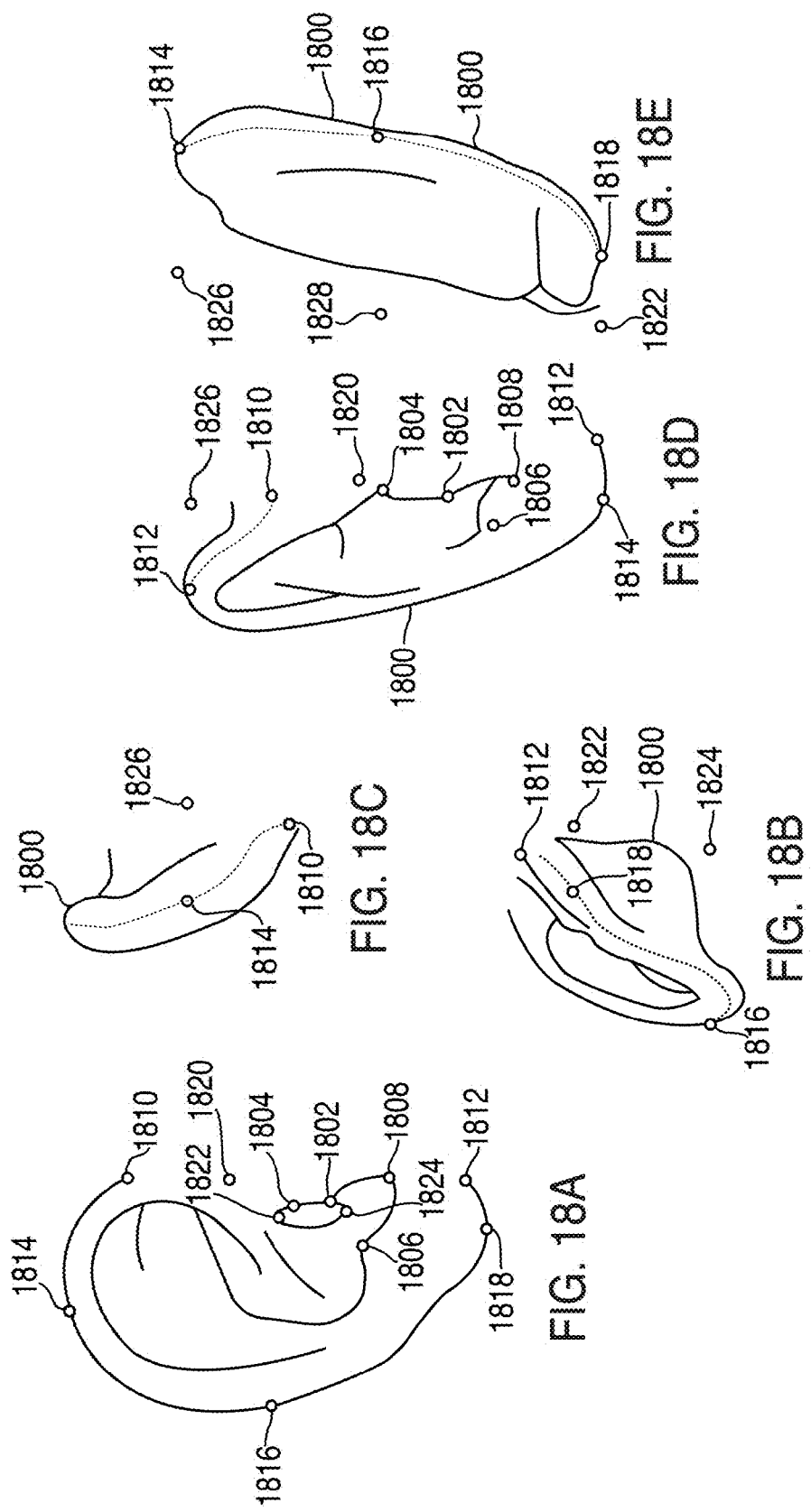

US 9,460,238 B2

METHODOLOGY FOR DETERMINING AN IMPROVED FORM OF HEADPHONES

CROSS-REFERENCE TO RELATED PROVISIONAL APPLICATION

This application claims the benefit of U.S. Provisional Patent Application No. 61/699,767 filed on Sep. 11, 2012, the disclosure of which is incorporated herein by reference in its entirety.

BACKGROUND

Headsets are commonly used with many portable electronic devices such as portable media players and mobile phones. Headsets can include one or more cables as well as various non-cable components such as a jack, headphones, and/or a microphone. The one or more cables can interconnect the non-cable components. The headphones, which are the components that generate sound, can exist in different form factors such as over-the-ear headphones, in-the-ear earbuds, or in-the-canal earphones. In-the-ear earbuds are sometimes referred to as non-occluding earbuds as they generally sit at the entrance of the user's ear canal and do not form an airtight seal.

Generally speaking, with conventional non-occluding earbuds, the absence of an airtight seal can affect acoustic performance as compared to other types of headphones, such as occluding or in-the-canal earphones. However, some users are willing to trade some degree of sound quality for the comfort level offered by in-the-ear, non-occluding earbuds.

A primary concern or factor for headphone design is creating parts that adhere to design constraints dictated by the size and the shape of electronic components that provide the functionality for the headphones. For example, in-the-ear earbud housing design has largely been driven by the need to create a form for the earbud that accommodates both the size of the headphone driver and the circular shape of the headphone driver. Although designers devote considerable effort to making in-the-ear earbuds that accommodate the circular driver aesthetically pleasing, the design process has been primarily driven by design constraints dictated by the electronic components, thus making comfort less of a factor in the design process.

Accordingly, there is a need for an improved methodology for determining a headphone form for earbuds, earphones and the like that is driven by both sound quality and comfort level.

SUMMARY

A methodology for determining the form for a headphone part using a representative model is described. Using data defining an ear model, the model is oriented within a coordinate system, with a focus on the alignment of one or more areas of the ear. A representative model is determined from a plurality of oriented ear models, where the representative model is a representation for a volume determined to be common to at least two oriented ear models. The size and shape of the headphone part is determined based upon the representative model.

BRIEF DESCRIPTION OF THE DRAWINGS

It is noted that the U.S. patent or application file contains at least one drawing executed in color. Copies of this patent or patent application publication with color drawings will be provided by the U.S. Patent Office upon request and payment of the necessary fee. The above and other objects and advantages of the inventive embodiments will be apparent upon consideration of the following detailed description, taken in conjunction with the accompanying drawings, in which like reference characters refer to like parts throughout, and in which:

FIG. 4D is a side perspective view of an exemplary earbud within a rendering of a representative model in accordance with some embodiments of the invention;

FIG. 4E is a top view of an exemplary earbud within a rendering of a representative model in accordance with some embodiments of the invention;

FIG. 4F is a bottom view of an exemplary earbud within a rendering of a representative model in accordance with some embodiments of the invention;

FIG. 4G is a side perspective view of an exemplary earbud within a rendering of a representative model in accordance with some embodiments of the invention;

FIG. 4H is a side perspective view of an exemplary earbud within a rendering of a representative model in accordance with some embodiments of the invention;

FIG. 18A is a sagittal view of an exemplary ear with landmark points for alignment of an ear model in accordance with some embodiments of the invention;

FIG. 18B is an axial bottom view of an exemplary ear with landmark points for alignment of an ear model in accordance with some embodiments of the invention;

FIG. 18C is an axial top view of an exemplary ear with landmark points for alignment of an ear model in accordance with some embodiments of the invention;

FIG. 18D is a coronal front view of an exemplary ear with landmark points for alignment of an ear model in accordance with some embodiments of the invention;

FIG. 18E is coronal back view of an exemplary ear with landmark points for alignment of an ear model in accordance with some embodiments of the invention;

DETAILED DESCRIPTION OF THE PREFERRED EMBODIMENTS

Figure 1:
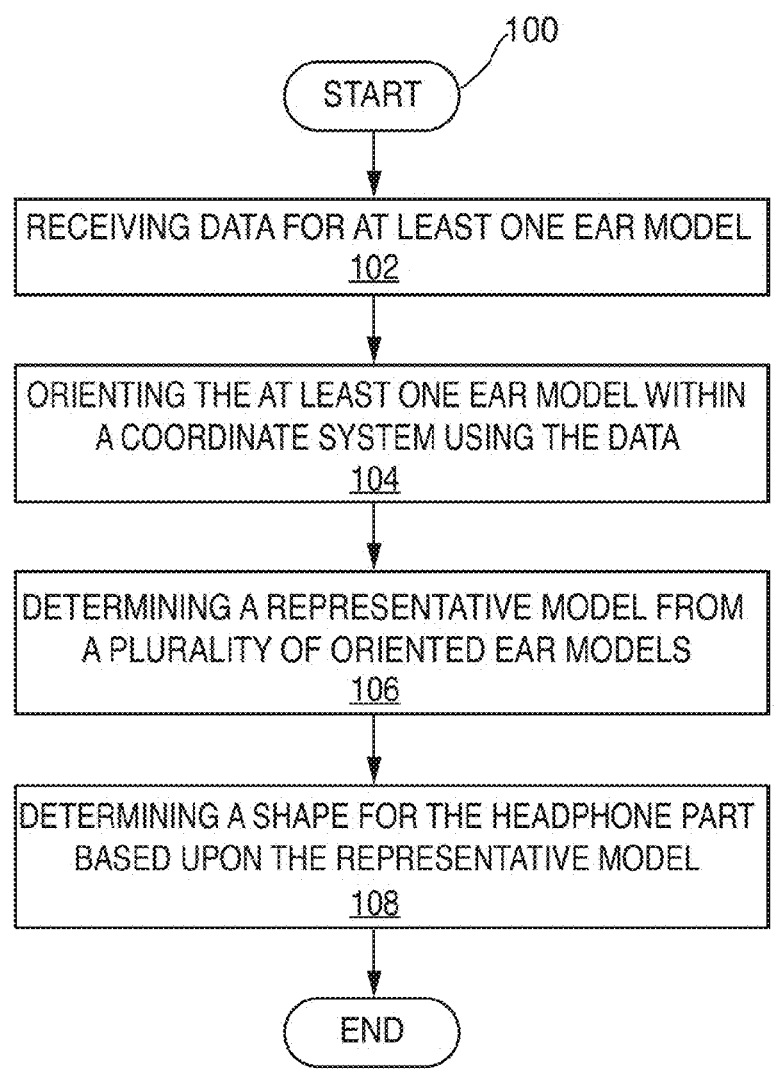
FIG. 1 is a flowchart for an exemplary method for determining a form for a headphone part using a representative ear model in accordance with some embodiments of the invention.

A methodology to determine an improved form for a headphone part using a representative model is described. The representative model may represent an estimate of a volume of space about one or more surfaces or features of the human ear and/or within one or more ear cavities available for receiving a headphone part. The volume may be a volume of negative or unoccupied space. The representative model may serve as a map or a guide for such volume. The representative model can be viewed as a representation or a model of a solution space for a headphone part.

The representative model may represent the volume using a collection of points in three-dimensional space. For example, the representative model may be one or more data files that can be used to render a visualization (e.g., an image) of the volume within a design application on a display. A visualization of the representative model may allow a designer to visualize both the volume of space available for accommodating a headphone part and/or the topography of the surfaces of the human ear about the volume of space.

A plurality of two-dimensional and/or three-dimensional models of surfaces and cavities of the human body may be used as a sample of the population for determining the representative model of the space and/or the surface area available for receiving a headphone part. In particular, models for ear surfaces and ear cavities from a wide spectrum of people may be used to create the representative model. By using a wide array of ear shapes and sizes for the creation of the representative model, a resulting headphone part, such as an earbud or an earphone, designed to fit within the representative model may better address user needs and provide a more consistent user experience with the headphone part across a greater number of users. In particular, an earphone shape may be determined that offers a salutary balance of acoustical performance, sound quality, comfort, and stability, and the earphone shape may fit within the representative model to better ensure that the improvements are experienced by a greater number of users.

Data for a plurality of two-dimensional and/or three-dimensional models of ear surfaces and cavities may be used to create the representative model. Data for an ear model may provide information on rendering a visualization of the ear model within a design application. For example, data for an ear model may be one or more data files with data for rendering the ear model within a Computer Aided Design (CAD) software application. Each ear model may be oriented within a coordinate system either manually by a user with a user interface of a design application and/or automatically by providing instructions to a design application, and the representative model may be determined from the oriented ear models.

The representative model is a volume determined to be common to at least two of the oriented ear models. In some embodiments, the representative model may be a volume that is available about surfaces of at least two oriented ear models. For example, the representative model may be a volume of negative space available above surfaces and within ear cavities of a plurality of oriented ear models. In other embodiments, the representative model may be a volume gleaned from the aggregation of the plurality of oriented ear models. For example, the representative model may be the volume solid formed when the plurality of ear models are oriented.

Each ear model used to form the representative model may be oriented within a coordinate system with a focus on alignment of one or more areas of the ear. During orientation of ear models within a design application, a rendering of a visualization for an ear model may overlay or overlap any number of renderings of visualizations for ear models displayed within the design application to properly align and display the oriented ear models within the coordinate system. The representative ear model may be a model determined from the oriented ear models for the volume common to the one or more oriented ear models. The representative ear model may then be used to guide and/or adjust design for a shape of a headphone part.

In some embodiments, determining an earphone form using a representative model may be an iterative process. The representative model may serve as a map or a guide of the space and the body surfaces available for creating an earphone shape. In particular, the representative model may be viewed as a starting off point for determining an earphone shape. Earphone prototypes may be created having shapes and sizes to fit within the representative model. These can be tested on users. Test data on each user's experience with a prototype may be recorded, and the earphone shape, size, and design may be adjusted based thereon.

Referring now to the drawings, FIG. 1 is a flowchart illustrating an exemplary method for determining a form for a headphone part using a representative ear model in accordance with some embodiments of the invention. In flowchart 100, data is received for at least one ear model (102). The data received provides information on rendering the ear model on a display. Data may be a collection of points in three-dimensional space or any other mathematical representation for modeling an ear. Data may be received in the form of one or more data files, such as CAD files, and the data for the ear model may be used for rendering a visualization of the ear model within a design application on a display.

The design application may be any suitable software application that provides the capability to render and/or orient two-dimensional and/or three-dimensional models within a coordinate system. Instructions for the software application may be executed on one or more processors of a data processing device (e.g., a computer system) and displayed on a display in communication with at least one processor. Design applications may be CAD applications, visualization applications, electronic design automation (EDA) applications, modeling applications, and/or any other application that can render the ear model and/or orient the ear model within a coordinate system.

At least one ear model may be oriented within a coordinate system using the data (104). The orienting of an ear model may be focused on an alignment of one or more areas of the ear with particular positions within the coordinate system. One or more landmark points for areas of the ear for focused orientation may be identified within the ear model. Landmark points may be identified as points in locations within the ear model relative to one or more other structures or features found on the surface of the ear and/or other surfaces of the human body.

During orientation of the ear model, each landmark point may be mated to a point, an axis, and/or a plane within the coordinate system to align particular areas of the ear. For example, the ear model may be oriented by a user of a design application by dragging and dropping a rendering of an ear model within a user interface of the CAD software application to a position to enable the user to visually align the ear model. In some embodiments, a script, a routine, and/or instructions for orienting the ear model may be loaded or received by the design application to orient the ear model within the coordinate system with alignment of the landmark points. Alternatively, the design application may receive instructions on alignment of landmark points to particular positions within the coordinate system through the use of a graphical user interface (GUI) of the design application.

A representative ear model may be determined from data for a plurality of oriented ear models (106). The plurality of oriented ear models may include the oriented ear model and any number of other ear models oriented with focused alignment of the same one or more areas of the ear with particular positions within the coordinate system. By aligning the same areas of ear models with relatively the same positions within the coordinate system, a representative model for a volume common to at least two of the plurality of oriented ear models may be determined.

Those with skill in the art will recognize that there are an infinite number of samples from the population with which a representative model can be created. Ear models may be selected to ensure that the representative model represents all of the population, a representative subset of the population, or a minority of the population. Ear models can be selected to represent a larger cross-section of the population and/or individuals with a specific characteristic. For example, ears from the population can be selected for the representative model based upon, but not limited to, the following characteristics: ear size, and a person's heritage, gender, age, location, and/or any other characteristic.

The representative model may be a volume of negative space common to at least two of the plurality of oriented ear models. The negative space may be the space around, within cavities, above, and otherwise unoccupied by a volume solid represented by one or more ear models. For example, the representative model may be a volume of space above surfaces and within cavities of an ear model. The representative model may be a volume common or shared by the plurality of oriented ear models, a subset of the plurality of oriented ear models, a majority of oriented ear models, an aggregation of the oriented ear models, and/or any number of oriented ear models from the plurality.

The shape for the headphone part may be determined based upon the representative ear model (108). A form for a headphone part may be designed to accommodate the volume common to the sample of ear models. The representative model can be used as a guide for the design of a part for the headphone. For example, the data for the representative ear model may be one or more data files for rendering the representative model within a CAD software application to allow designers to visualize the volume within the coordinate system. The representative model can be used as a starting off point for determining the shape and size of a headphone part.

Figure 2:
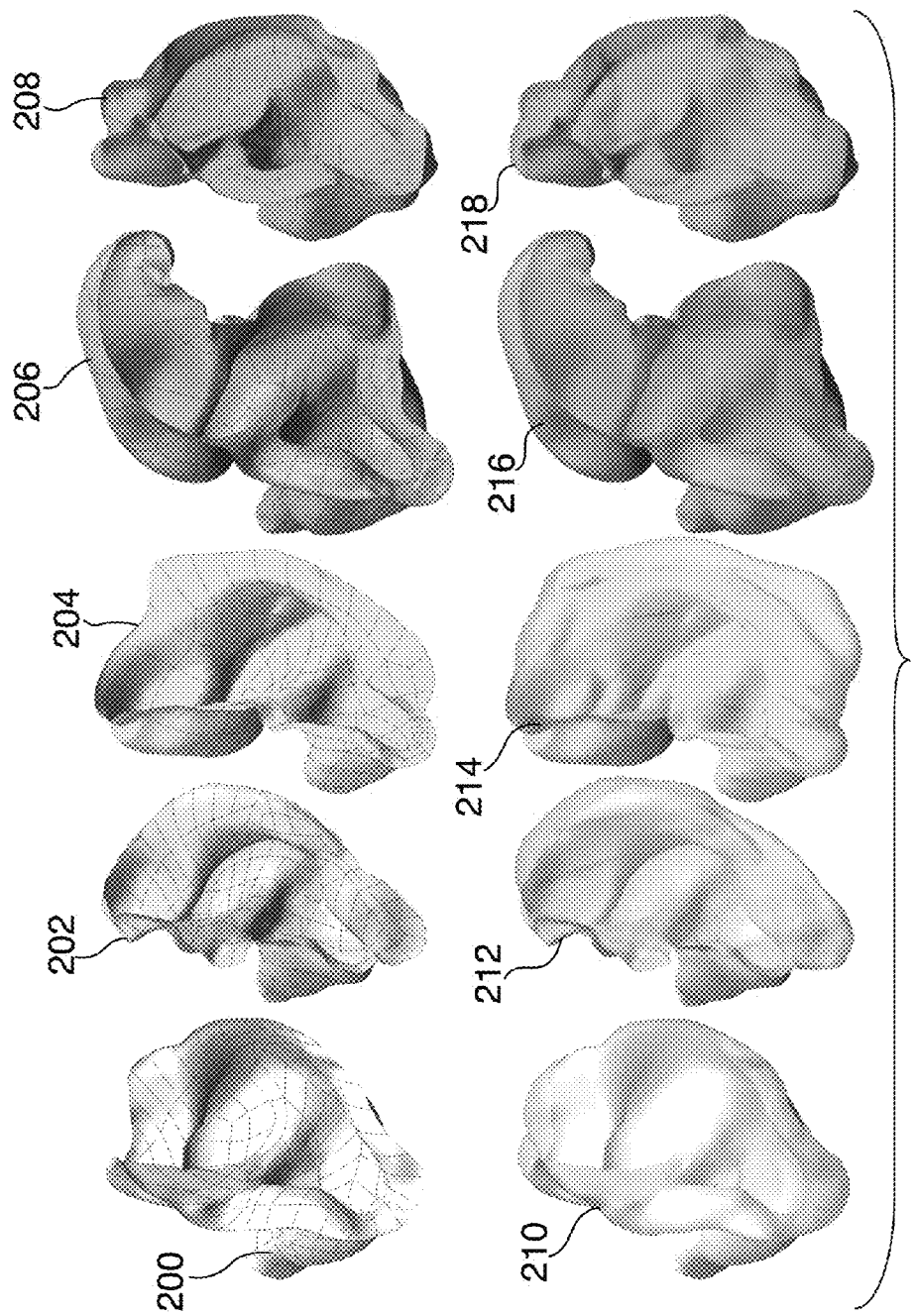
FIG. 2 is an illustrative view of a plurality of exemplary ear models in accordance with some embodiments of the invention.

FIG. 2 is an illustrative view of a plurality of exemplary ear models in accordance with some embodiments of the invention. Reference numbers 200, 202, 204, 206, and 208 denote exemplary ear models created with one or more ear surface scans. Each such ear model may be used to create a representative model. Reference numbers 210, 212, 214, 216, and 218 denote exemplary three-dimensional ear models created with one or more full molded solids; and each such ear model may be used to create a representative model. Ear models can be created using any suitable modeling method, including, but not limited to: one or more scans of ear surfaces and/or cavities, ear molds, Magnetic Resonance Imaging (MRIs). For example, the ear model may be a model of an actual ear created using multiple scans of an ear with an in-line video scanner or a 3-D scanner, a mold of the surface of the ear, a mold of an ear cavity, and/or a combination thereof.

Scanners may have line of sight issues when trying to capture surfaces, structures and features of the ear surface, and/or ear cavities. As such, scans of different areas or portions of the ear may be stitched together to form a single model. For example, CAD data files may have a hierarchical structure with an assembly file (.asm extension file) that provides instruction on assembling a model with one or more other data files with instructions for rendering portions of the ear model. The CAD files may indicate to a CAD system or any other visualization software how to render and assemble a visualization for an ear model. In the simplest case, the visualization data files may consist of separate data files for each scan of a portion of the ear and the data files may be assembled to produce a visualization of the ear using each data file for a scanned portion of the ear.

Figure 3A:
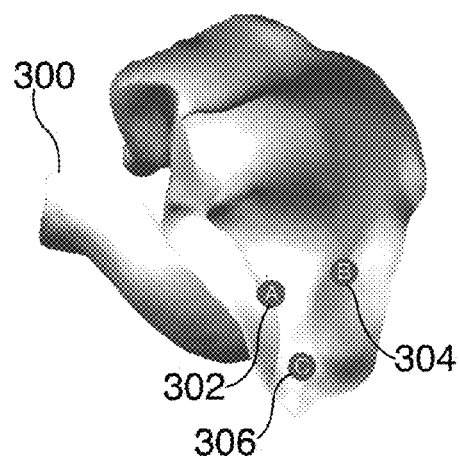
FIG. 3A is an illustrative view of an exemplary ear model for creation of a representative ear model in accordance with some embodiments of the invention.

FIG. 3A is an illustrative view of an exemplary ear model for creation of a representative ear model in accordance with some embodiments of the invention. Landmark points 302, 304, and 306 may be identified on ear model 300. Landmark points are points on an ear model that can be identified within the ear model as having positions relative to one or more structures or features found on an ear surface of ear model 300.

As illustrated in FIG. 3A, landmark point 302 is a point on a tip of the tragus, landmark point 304 is a point on the tip of the antitragus, and landmark point 306 is a point at the midpoint between the tragus and the antitragus found on ear model 300. Landmark points can be selected for orientation of the ear model to enable focused alignment of the ear model on the one or more areas of the ear model where landmark points are located.

Figure 3B:
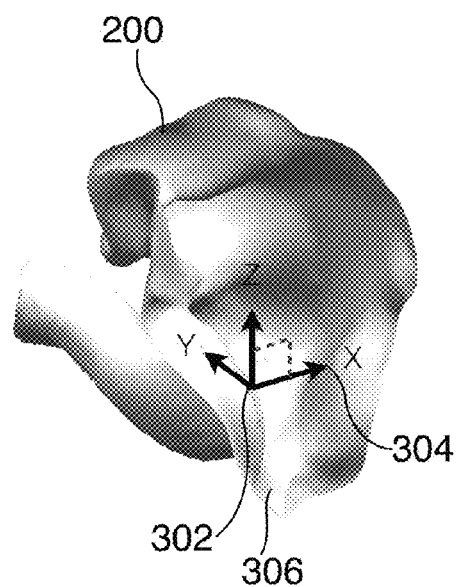
FIG. 3B is an illustrative view of an exemplary orientation of an ear model in accordance with some embodiments of the invention.

FIG. 3B is an illustrative view of an exemplary orientation of an ear model in accordance with some embodiments of the invention. Landmark points 302, 304, and 306 can be aligned and/or mated to positions within a coordinate system. As shown in FIG. 3B, landmark point 302 is mated to the origin, landmark point 304 is mated to the x-axis, and landmark point 306 is mated to the x-z plane.

Figure 3C:
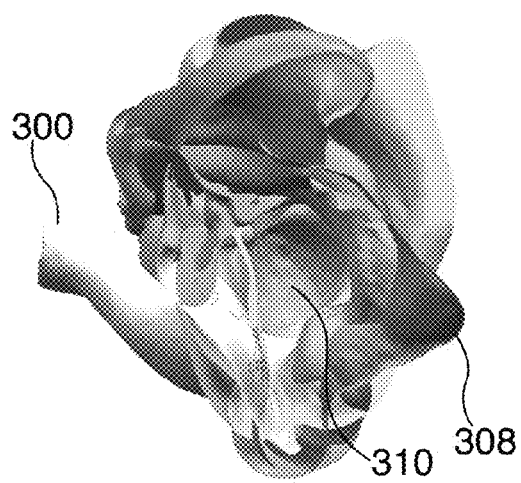
FIG. 3C is an illustrative view of exemplary ear models oriented for determining a representative ear model in accordance with some embodiments of the invention.

FIG. 3C is an illustrative view of exemplary oriented ear models for determining a representative ear model in accordance with some embodiments of the invention. After ear model 300 is oriented within the coordinate system with alignment focused on the tragus, the antitragus, and the midpoint between tragus and antitragus areas of the ear, oriented ear model 300 and other oriented ear models may be used to determine a representative model. As shown, a visualization of ear model 300 may overlay other oriented ear models and/or other oriented ear models may overlay the visualization for ear model 300 to allow for determining and visualizing a representative ear model.

From the oriented ear models, a volume common to or shared by at least two oriented ear models may be determined. For example, a volume of space about surfaces and within cavities of the oriented ear models (e.g., the space above the surface and within cavities of the volume solid formed by the oriented ear models) may be determined, as illustrated in FIGS. 4B-4H. As shown in FIG. 3C, visualizations of the oriented ear models may make it more apparent that there is a volume of space 310 common to the oriented ear models 308 just above the conchas of the oriented models that may be incorporated into a representative model for the oriented ear models in FIG. 3C.

Figures 4A, 4B, 4C:
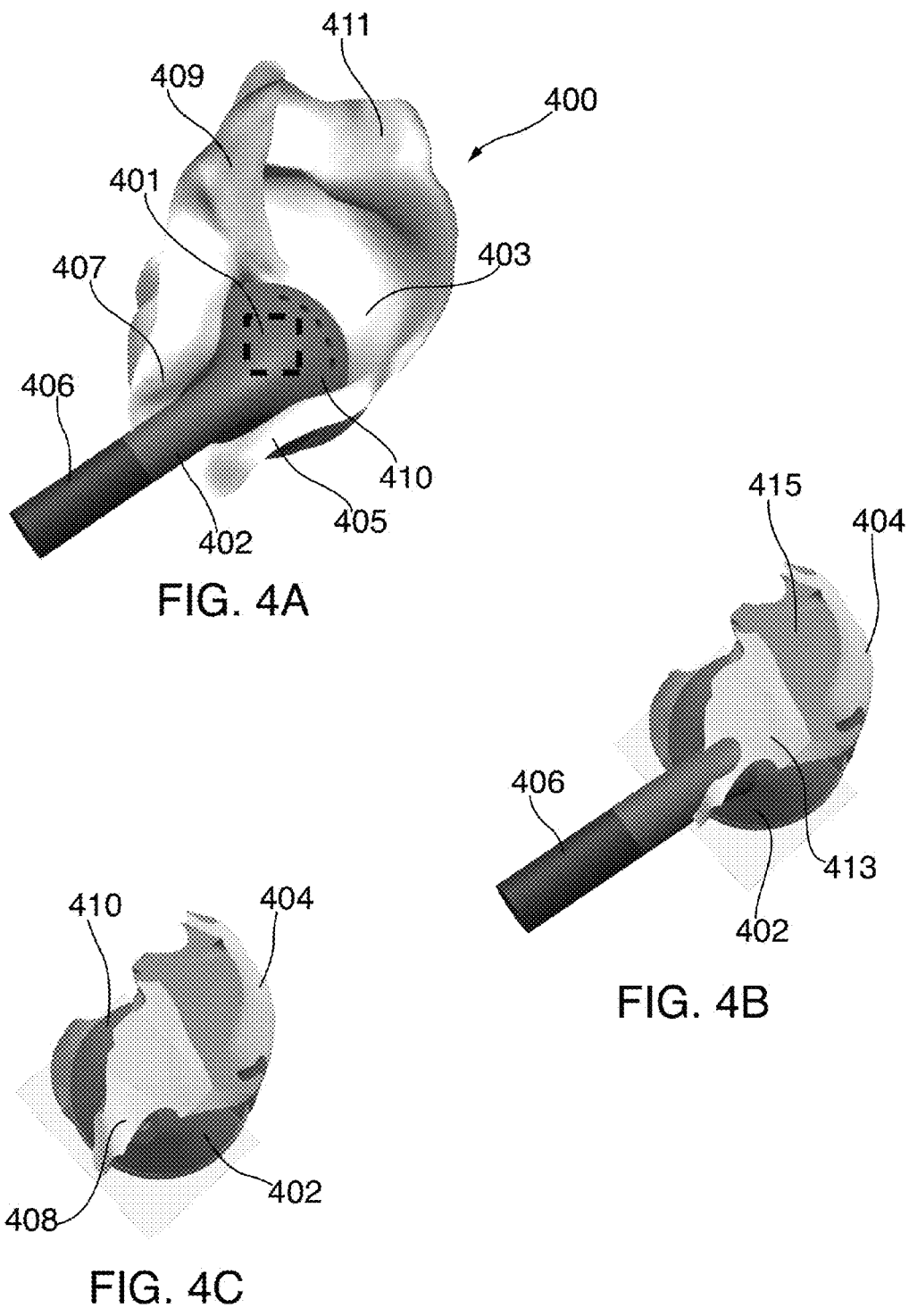
FIG. 4A is an illustrative view of an exemplary earbud within an ear in accordance with some embodiments of the invention.
FIG. 4B is a front view of an exemplary earbud within a rendering of a representative model in accordance with some embodiments of the invention.
FIG. 4C is a front view of an exemplary earbud with the tail removed within a rendering of a representative model in accordance with some embodiments of the invention.

FIG. 4A is an illustrative view of exemplary in-the-ear, non-occluding earbud 402 within ear 400 in accordance with some embodiments of the invention. FIG. 4A provides a frame of reference for illustrative views in FIGS. 4B-4H, which show a comparison of space available (e.g., represented with a rendering of representative model 404) to space consumed by earbud 402. A rendering of ear model 400 is shown with earbud 402 sitting within ear 400. In particular, earbud body 410 sits in the ear above the meatus 401 (not shown, depicted with dashed square) and may completely cover the meatus 401 of ear 400. Earbud 402 may also sit within concha 403 of ear 400. Earbud tail 406 may fit between antitragus 405 and tragus 407 of the ear 400. Earbud body 410 may just touch or sit just below crus of helix 409 and rest within concha 403 below antihelix 411 of ear 400.

FIG. 4B is a front view of exemplary earbud 402 within a rendering of representative model 404 in accordance with some embodiments of the invention. FIG. 4B provides a front view of earbud 402 within a rendering of representative model 404. Representative model 404 is a volume of space available to at least two oriented ear models within a coordinate system. Representative model 404 may be a volume of space determined from a plurality of oriented ear models for a sample representing a larger cross-section of the population to ensure representative model 404 can serve as a guide for a part that meets the needs of a greater number of users.

In the design process, a view of the space available within a plurality of ears, as illustrated with representative model 404, and the space that may be consumed by earbud 402 and earbud tail 406 may be desirable. For example, designers may develop earbud shapes that consume more of the available space and/or better utilize the available space to provide a headset part that both fits the functional components of the headset and is more comfortable for a greater number of users.

Representative model 404 is a model that illustrates the amount of space available and may provide a mapping of the space with an indication of the underlying topography of ear surfaces below representative model 404. For example, a rendering of representative model 404 may provide a first shading or color to depict space above meatus 413 for a plurality of oriented ear models and a second color or shading to depict space above antihelix 415 for a plurality of oriented ear models. Those with skill in the art will recognize that there are many modeling techniques that can be employed to indicate the topography of surfaces beneath a volume. Thus, any suitable modeling technique may be used to illustrate the available space and the underlying topography of the ear surfaces of ear models in representative model 404.

FIG. 4C is a front view of exemplary earbud 402 with earbud tail 406 removed and sitting within a rendering of a representative model 404 in accordance with some embodiments of the invention. In FIG. 4C, earbud 402 is shown within a visualization of representative model 404, and FIG.

4C illustrates the available space in the volume provided with the visualization of the representative model 404 without obstruction by earbud tail 406.

As illustrated in FIG. 4C, there is space 408 available as shown with representative model 404 for adjustment or modification of the placement or coupling of earbud tail 406 onto earbud body 410. For example, representative model 404 shows that earbud tail 406 may be coupled to earbud body 410 at a position offset from the center of earbud body 410 and/or offset from the current position for the coupling of earbud tail 406 on earbud body 410 so as to occupy more of the available space 408 between tragus 407 and anti-tragus 405. Furthermore, by moving the placement of earbud tail 406 to better fit within the available space as illustrated with representative model 404, earbud tail 406 may better fit and offer more stability between tragus 407 and anti-tragus 405 for a greater number of users.

FIG. 4D is a side, perspective view of exemplary earbud 402 within a rendering of representative model 404 in accordance with some embodiments of the invention. This view illustrates the amount of space 412 available within the ear canal and space 414 above earbud 402 for a plurality of oriented ear models.

FIG. 4E is a top view of exemplary earbud 402 within a rendering of representative model 404 in accordance with some embodiments of the invention. This view illustrates the amount of space 412 available within the ear canal and space 414 above earbud 402 for a plurality of oriented ear models from a different angle.

FIG. 4F is a bottom view of exemplary earbud 402 within a rendering of representative model 404 in accordance with some embodiments of the invention. This view illustrates the amount of space 412 available within the ear canal and space 414 above earbud 402 for a plurality of oriented ear models from a different angle.

FIG. 4G is a side perspective view of earbud 402 within a rendering of representative model 404 in accordance with some embodiments of the invention. This view illustrates the amount of space 412 available within the ear canal and space 414 above earbud 402 for a plurality of oriented ear models from a different angle.

FIG. 4H is a side perspective view of exemplary earbud 402 within a rendering of representative model 404 in accordance with some embodiments of the invention. This view illustrates the amount of space 412 available within the ear canal and space above earbud 402 for a plurality of oriented ear models from a different angle.

Figure 5A:
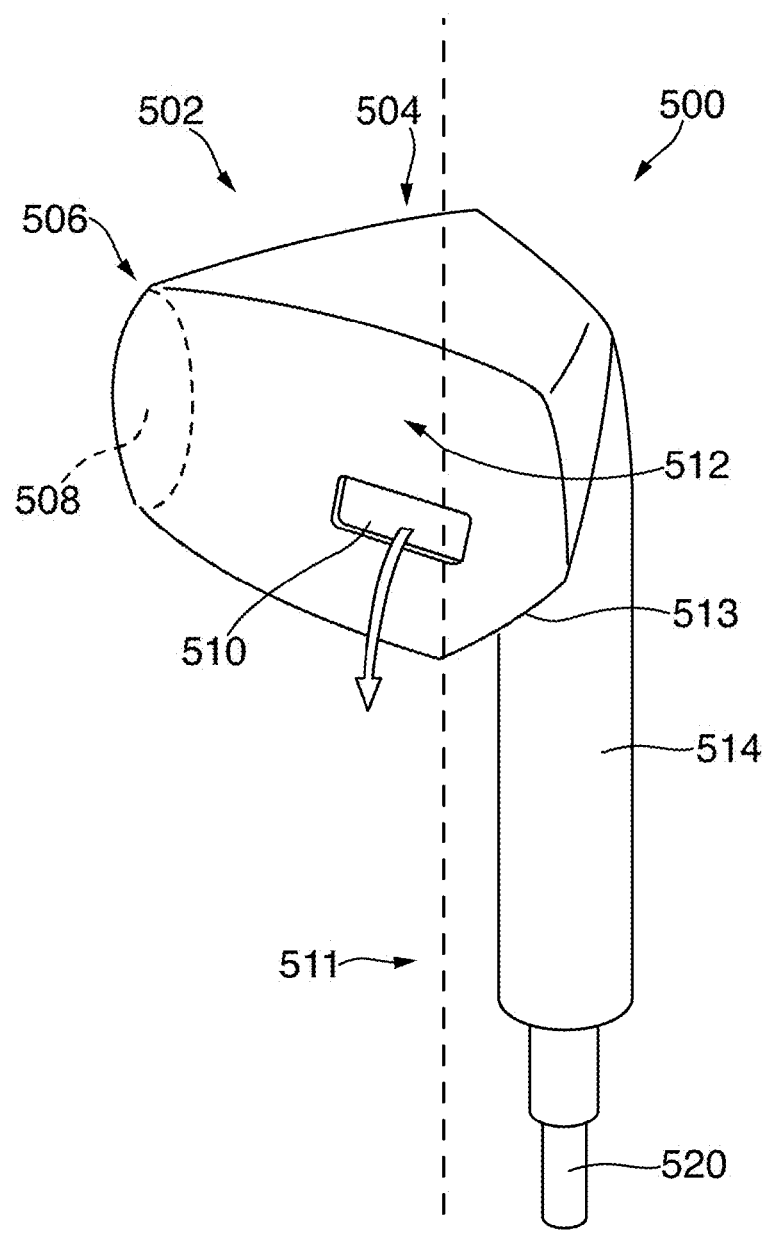
FIG. 5A is an exemplary earphone designed using a representative model in accordance with some embodiments of the invention.

FIG. 5A is a perspective view of an exemplary earphone designed using a representative model in accordance with some embodiments of the invention. Earphone 500 may sit within the concha of the ear (in this example, a right ear) and extend into the ear canal for improved acoustic performance. FIGS. 4B-4H illustrate with representative model 404 the space available within the concha 413 for earphone 500 and space within ear canal 412 for extension of earphone 500 into the ear canal. Earphone housing 502 may form a body portion 504, which rests within the concha like an in-the-ear earbud, and a tip portion 506, which extends into the ear canal similar to an in-the-canal earphone. A receiver or driver (not shown) may be contained within housing 502.

A tube portion 514 may extend from body portion 504. Tube portion 514 may be dimensioned to contain a cable 520, which may contain wires extending from a powered sound source (not shown) to the driver. In FIG. 4C, representative model 404 illustrates space 408 available for attachment of tube portion 514 in a plurality of ear models. In particular, representative model 404 may be used to locate positions for placement of tube portion 514 on body portion 504 of earphone 500 to best form a hook 513 that can stabilize the earphone with respect to the ear between tragus 407 and anti-tragus 405 for a greater number of users.

Housing 502 may include a primary output opening 508 and a secondary output opening 510. Primary output opening 508 may be formed within tip portion 506. When tip portion 506 is positioned within the ear canal, primary output opening 508 outputs sound produced by the driver (in response to audio signals) into the ear canal. Primary output opening 508 may have any size and dimensions suitable for achieving a desired level of acoustic performance by earphone 500. In particular, primary output opening 508 may be a directional sound port that is offset from a center axis 511 of earphone 500, such that when earphone 500 is placed in a user's ear, primary output opening 508 is positioned to direct sound directly into the user's ear canal.

Secondary output opening 510 may be formed within body portion 504. Secondary output opening 510 may be dimensioned to provide a vent for the ear canal and/or output sound from earphone 500 to the external environment outside of earphone 500. In one embodiment, secondary output opening 510 is formed within a face portion 512 of body portion 504. Face portion 512 may face a pinna region of the ear (i.e., the meaty portion of the external ear that projects from the side of the head) when tip portion 506 is positioned within the ear canal. Secondary output opening 510 therefore faces the pinna region when earphone 500 is positioned within the ear.

In FIG. 4H, a space 416 of representative model 404 shows unused space in front of earbud 402. Representative model 404 may serve as a guide in the design process for positioning secondary output opening 510 within body portion 504 of earphone 500 so as to face and not touch concha 505 (the curved cavity portion of pinna portion 503 that leads into ear canal 507) so as to provide an unobstructed vent in a greater number of user's ears.

Figure 5B:
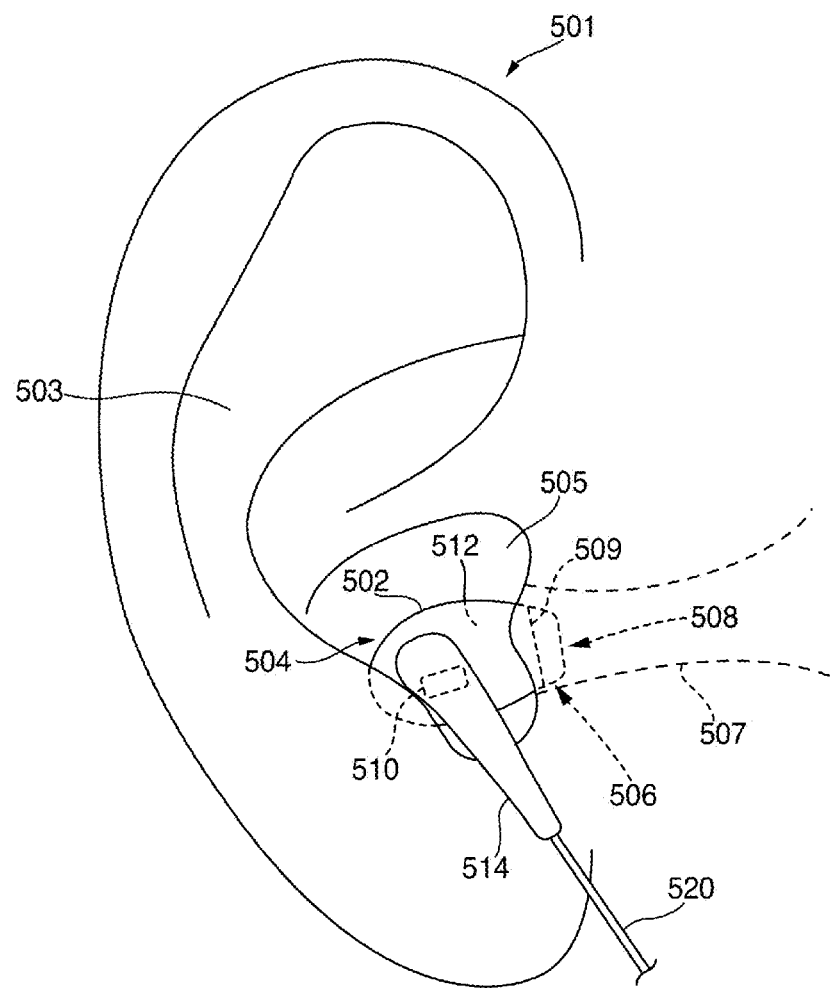
FIG. 5B is an exemplary earphone designed using a representative model shown within an ear in accordance with some embodiments of the invention.

FIG. 5B is an exemplary earphone designed using representative model 404 in accordance with some embodiments of the invention. FIG. 5B illustrates a side view of an embodiment of the earphone worn within a right ear. Earphone 500 may be positioned within ear 501 so that tip portion 506 extends into ear canal 507 and body portion 504 rests within concha 505.

The tapered shape of tip portion 506 may allow for primary output opening 508 of tip portion 506 to extend into ear canal 507 and not form a seal. Representative model 404 as depicted from various angles in FIGS. 4B-4H provides a map or guide to the space available for designing a non-occluding earphone that can provide a directional sound port (e.g., primary output opening 508) without creating a seal in the ear for a greater number of users.

Figure 6A:
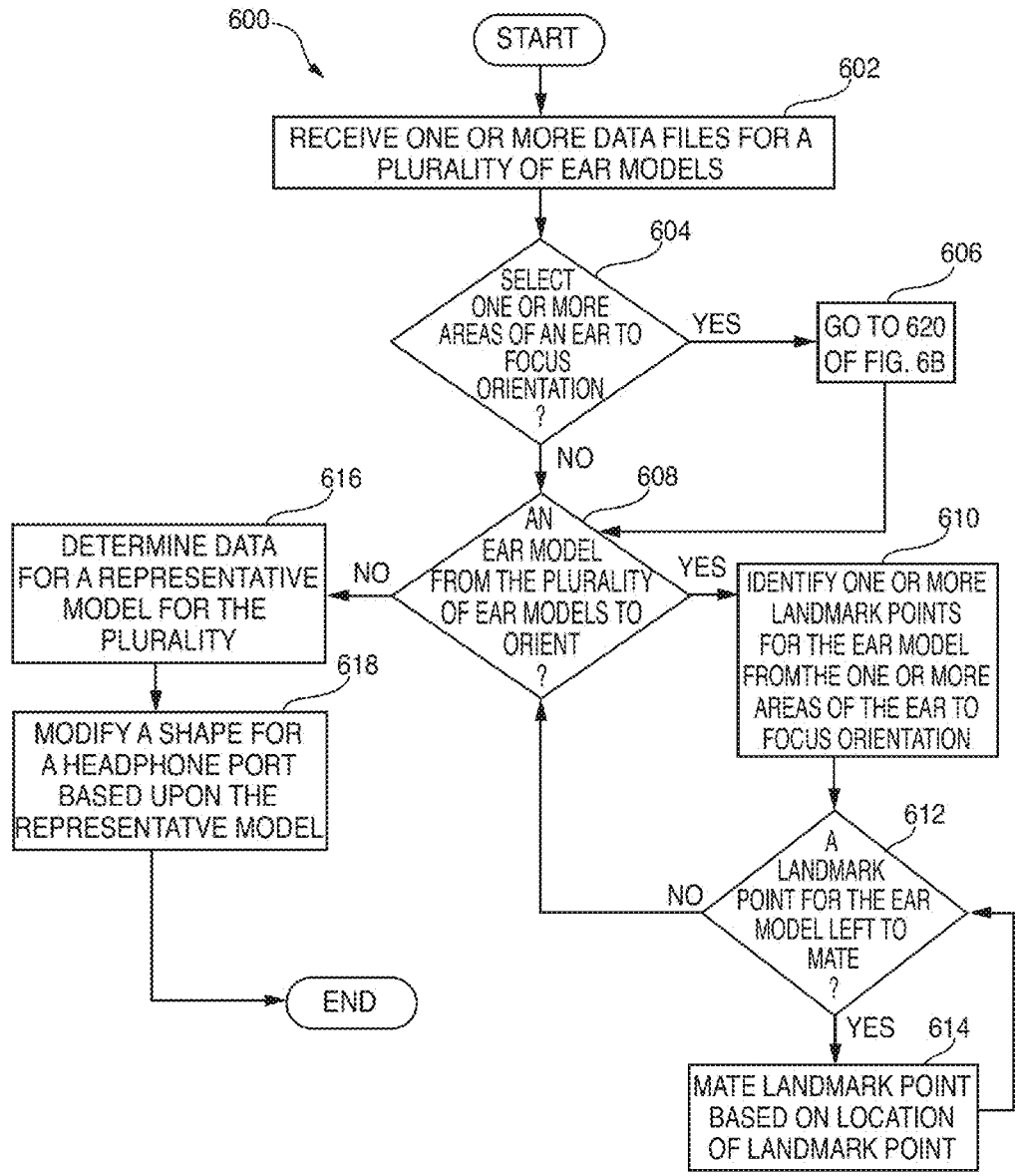
FIG. 6A is a flowchart for an exemplary method for determining a form for a headphone part using a representative ear model in accordance with some embodiments of the invention.

FIG. 6A is an exemplary flowchart for a method for determining a form for a headphone part using a representative ear model in accordance with some embodiments of the invention. In flowchart 600, one or more data files for a plurality of ear models may be received (602). Each ear model may have one or more data files that are used to depict or render the ear model on the display. The one or more data files for an ear model may be CAD files that can be used to render a visualization for the ear model within a CAD application.

A determination is made as to whether one or more areas of an ear have been selected for focused orientation (604). If one or more areas of the ear have not been selected for focused orientation, then one or more areas of the ear for focused orientation may be selected (606), as illustrated in flowchart 620 of FIG. 6B and described in more detail below.

Continuing with FIG. 6A, when one or more areas of the ear have been selected, then a determination is made as to whether an ear model from the plurality of ear models needs to be oriented (608). Each ear model from the plurality of ear models for determining the representative model is oriented within the coordinate system. If a determination is made that an ear model from the plurality of ear models needs to be oriented (608), then one or more landmark points are identified for the ear model from the one or more areas of the ear to focus orientation within the coordinate system (610). Each landmark point for the ear model is used to orient the ear model within the coordinate system. The landmark point is a point identified within the ear model as a location relative to one or more features and/or structures found in the ear model.

A determination is made as to whether a landmark point for the ear model needs to be mated to a position within the coordinate system (612). Each landmark point is mated to a position within the coordinate system based upon the location of the landmark point (614). To ensure focused orientation for each of the ear models, landmark points with the same relative location for each of the ear models are mated to the same point, plane, and/or axes within the coordinate system.

A GUI of a design application may be used to mate the landmark point to a particular position in one or more embodiments. For example, landmark points and the corresponding positions for aligning landmark points may be entered via the GUI of the design application. Alternatively, a script may be executed to ensure that each of the landmark points is mated to a particular position within the coordinate system based upon the location of the landmark point. For example, a script may be loaded into the design application that may control compilation and execution and/or interpretation of the script for mating each of the landmark points to a particular position.

If there are no more landmark points left to mate for the ear model (612), then the process returns to check whether there are any more ear models from the plurality of ear models left to orient (608). If there are no more ear models left to orient (608), then data for a representative model is determined (616).

Data for a representative ear model for the plurality of ear models is determined for the plurality from the oriented ear models. The representative model may be determined from a three-dimensional or two-dimensional shape that is an aggregation of the oriented plurality of ear models and/or the surface created by the oriented plurality of ear models. The representative model may have a shape with a volume that is common to at least two ear models from the plurality of ear models. For example, the representative model may be a volume of negative space above a surface formed from the plurality of oriented ear models. For example, the volume may be the negative space within an ear for placement of an in-the-ear earbud, such as, for example, the ear canal and above the concha surface just beneath the anti-helix, for a plurality of oriented ear models.

Data for the representative ear model may be a mathematical representation, a collection of data points, one or more data files that may be used to render a visualization for the representative ear model for the plurality of oriented ear models, or any other representation that can communicate the volume. A shape for a headphone part may be modified based upon the representative ear model (618).

Figure 6B:
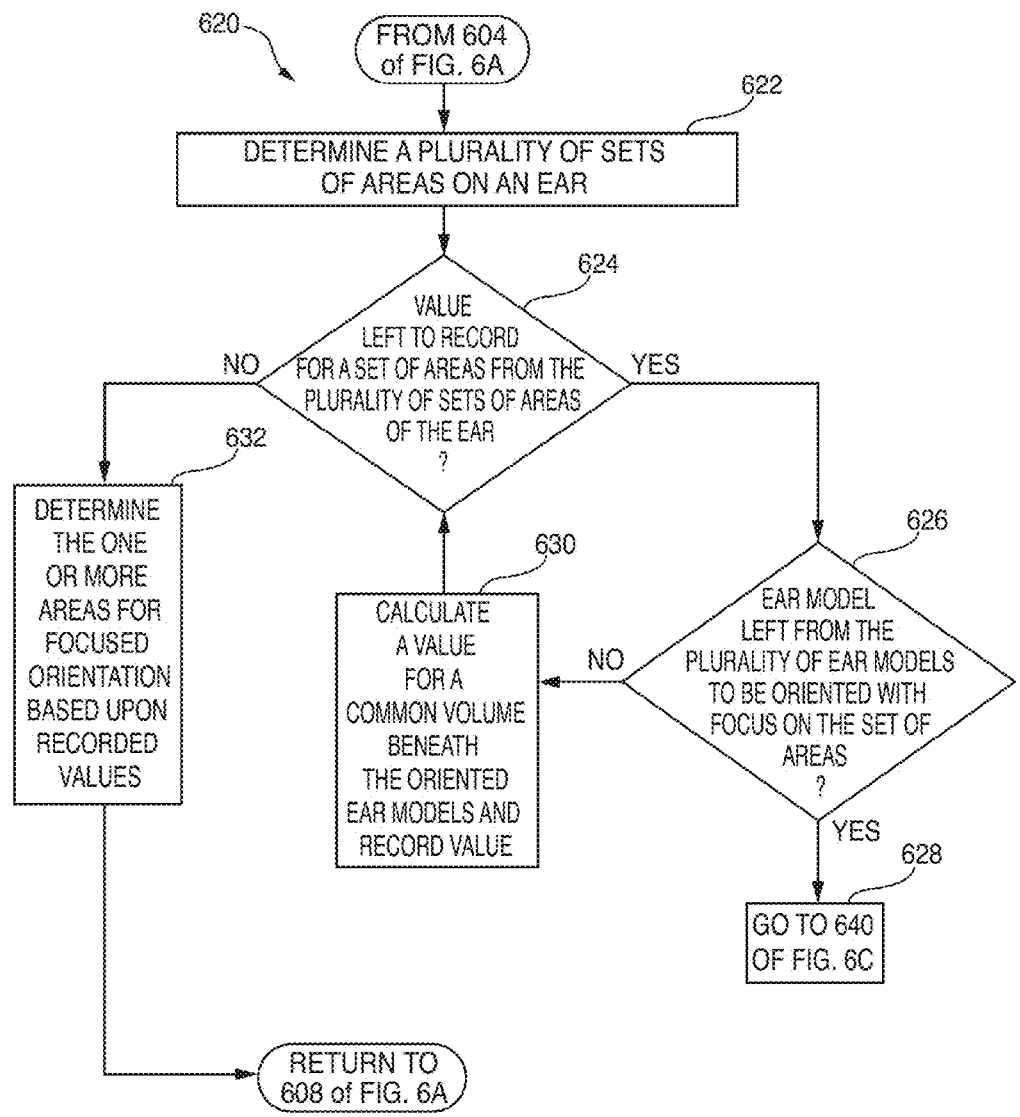
FIG. 6B is a flowchart for an exemplary method of selecting one or more areas of an ear to focus orientation of ear models within a coordinate system in accordance with some embodiments of the invention.

FIG. 6B is an exemplary flowchart for a method of selecting one or more areas of an ear to focus orientation of ear models within a coordinate system. In flowchart 620, a plurality of sets of areas of ears is determined (622). A set of areas of an ear may have one or more potential areas of an ear to focus alignment of the ear model within the coordinate system.

Values are recorded to gauge the success of focused orientation on each set of areas of an ear from the plurality of sets of areas. A determination is made as to whether there is a value to record for a set of areas from the plurality of sets of areas (624). If a value is to be recorded for a set of areas (624), then each ear model from the plurality of ear models is oriented with focus on the set of areas (626).

A determination is made as to whether an ear model is left from the plurality of ear models to be oriented with focus on the set of areas (626). If an ear model is left to be, then the process proceeds to the method described in FIG. 6C (628) to orient the ear model with focused alignment on one or more areas of the ear. After orienting the ear model from the plurality of ear models (628), a determination is again made as to whether there are any ear models left from the plurality of ear models to be oriented within the coordinate system (626).

Continuing with FIG. 6B, if no ear models are left from the plurality of ear models to be oriented with focus on the set of areas (626), then a value is calculated for a common volume beneath the oriented ear models and the value is recorded for the set of areas (630). Values may be recorded by storing them within a database and associating them with the sets of areas. The database may be any collection of data including, but not limited to, a relational database, an object oriented database, a file system and/or any other collection of data.

A determination is made as to whether there is a value to record for a set of areas from the plurality of sets of areas of the ear (624). If there are no more sets of areas to record a value for the orientation of the plurality of ear models on the set of areas (624), then one or more areas are selected for focused orientation based upon the recorded values (632).

The recorded values associated with each set of areas may be retrieved from the database, and the set of areas with the largest recorded value may be selected.

Figure 6C:
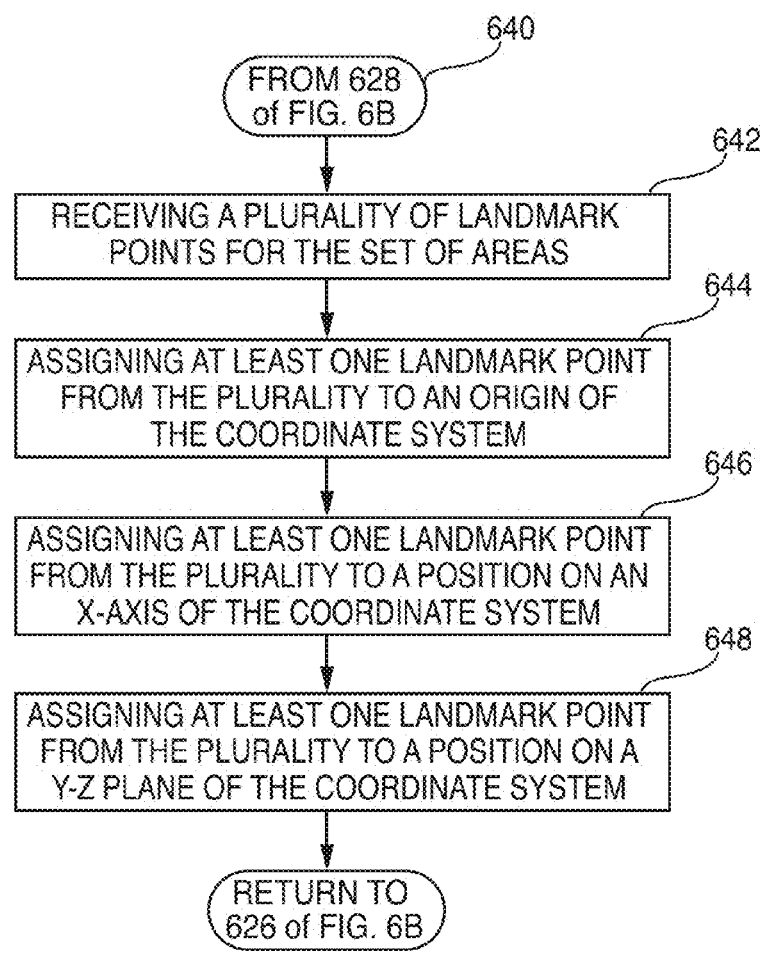
FIG. 6C is a flowchart for an exemplary method of orienting an ear model within a coordinate system on one or more areas of an ear in accordance with some embodiments of the invention.

FIG. 6C is an exemplary flowchart for a method of orienting an ear model within a coordinate system on one or more areas of an ear in accordance with some embodiments of the invention. In flowchart 640, a plurality of landmark points for one or more areas from the set of areas is received (642). Landmark points may be used to ensure that each of the ear models used to create the representative ear model is oriented the same way within the coordinate system. Landmark points with the same relative position within the ear model may be assigned to the same relative position within the coordinate system.

At least one landmark point from the plurality of landmark points is assigned to an origin of the coordinate system (644). For example, a landmark point at the tip of the tragus on each ear model may be assigned or mated to the origin of the coordinate system. At least one landmark point from the plurality of landmark points is assigned to a position on an x-axis of the coordinate system (646), and at least one landmark point from the plurality of landmark points is assigned a position on a y-z plane of the coordinate system (648). Continuing with the example, a landmark point at the tip of the antitragus on each ear model may be assigned or mated to the x-axis within the coordinate system, and a landmark point at the midpoint between the tragus and the antitragus may be assigned or mated to a position within the y-z plane.

Figure 7:
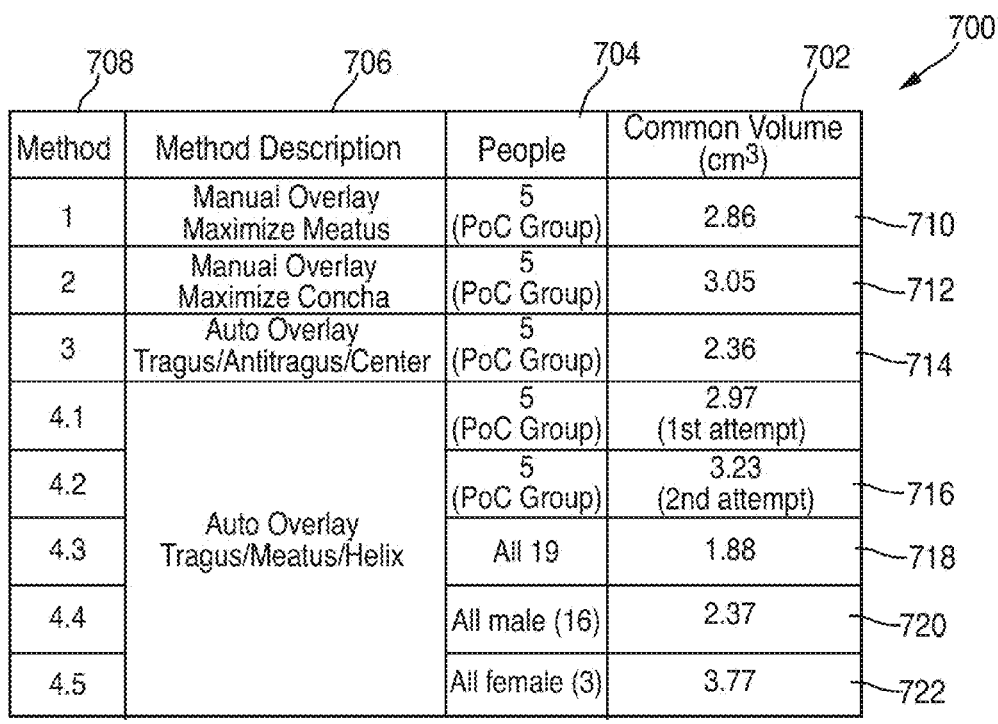
FIG. 7 is an exemplary chart with recorded values for common volumes of oriented ear models in accordance with some embodiments of the invention.

FIG. 7 is an exemplary chart with recorded values for common volumes of oriented ear models in accordance with some embodiments of the invention. Chart 700 illustrates recorded values for oriented ear models with a focus on sets of areas of an ear. In particular, chart 700 illustrates recorded values for common volumes calculated for oriented ear models in column 702, entitled "Common Volume (cm$^3$)." The common volume values are recorded for groups of ear models for people identified in column 704, entitled "People." Either manual overlay or auto overlay orientation method values are recorded in chart 700 as indicated in column 706, entitled "Method Description," for the corresponding method in column 708, entitled "Method."

Values are recorded to gauge the success of focused orientation on each set of areas from the plurality of sets of areas. For example, row 710 shows a recorded value of "2.86" for a common volume for method "1" using method "Manual Overlay" with focused orientation to "Maximize Meatus" area for a sample of five people for the PoC (Proof of Concept) group with the name "PoC Group." For the same sample "PoC Group," row 712 shows a recorded value of "3.05" for method "2" using method "Manual Overlay" with focused orientation to "Maximize Concha." Between the two manual overlay approaches using the same sample, method "2" has the larger common volume and focused orientation on the "Concha" may be preferable.

Continuing with the example of recorded values in FIG. 7, between "Auto Overlay" approaches, orientation focused on "Tragus/Meatus/Helix" with a common volume of "3.23" as shown in row 716 may be preferable to orientation focused on "Tragus/Antitragus/Center" as shown in row 714. Between "Auto Overlay" method in row 716 and "Manual Overlay" method in row 712, "Auto Overlay" may be preferred with a value of "3.23." Rows 720 and 722 show values for focused orientation using a sample with a particular characteristic of gender (i.e., row 720 is a sample of males and row 722 is a sample of females). Row 718 shows a recorded value of "1.86" for a common volume using "Auto Overlay" with focused orientation on "Tragus/Meatus/Helix" on a sample of 19 users.

Figure 8:
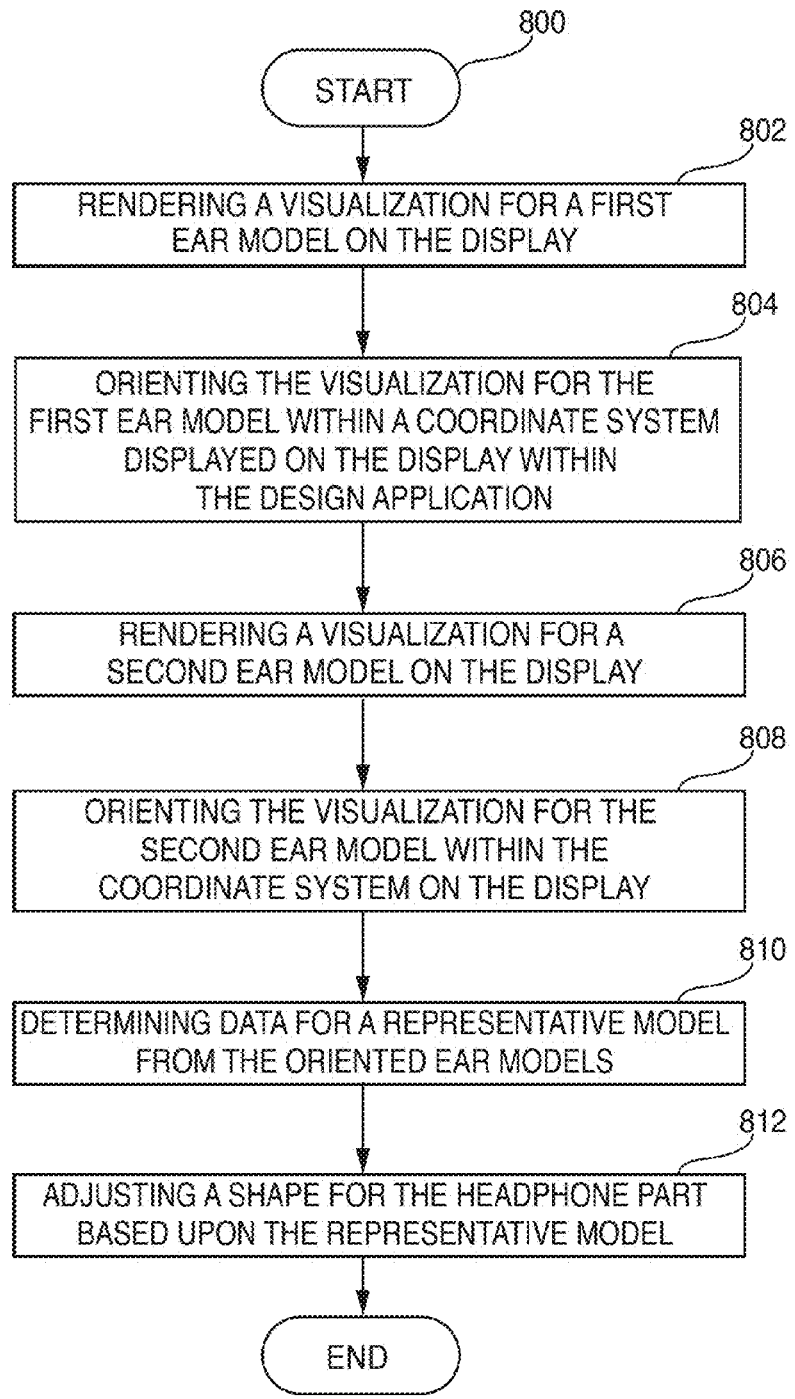
FIG. 8 is an exemplary flowchart for a method for determining a form for a headphone part using a representative ear model in accordance with some embodiments of the invention.

FIG. 8 is an exemplary flowchart for a method for determining a form for a headphone part using a representative ear model in accordance with some embodiments of the invention. Flowchart 800 shows a process for creation of a representative ear model using manual overlay for orienting a plurality of ear models within a coordinate system. A visualization for a first ear model is rendered on the display within a software design application (802). The first ear model is oriented within a coordinate system on the display within the design application (804).

A visualization for a second ear model is rendered on the display (806) and a user interacting with the design application may orient the visualization for the second ear model within the coordinate system (808). The second ear model may overlay the first ear model on the display. Data for a representative ear model may be determined from the oriented ear models (810). A shape for a headphone part may be adjusted based upon the representative model (812).

Figure 9A:
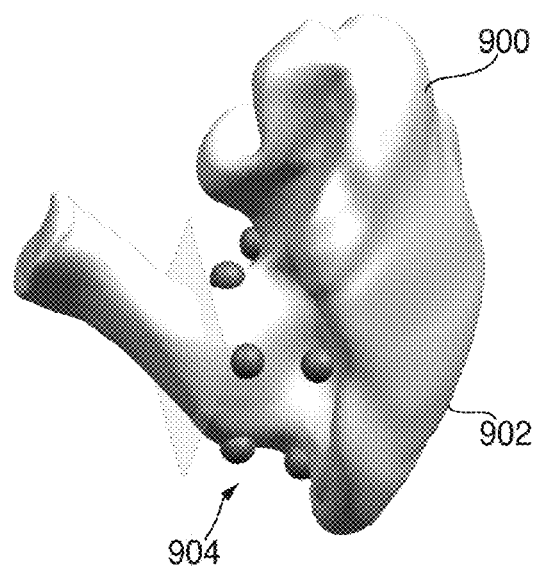
FIG. 9A is an illustrative view of an exemplary model of an object with visual indicators for recording comfort information in accordance with some embodiments of the invention.

FIG. 9A is an illustrative view of an exemplary model of an object with visual indicators for recording comfort information in accordance with some embodiments of the invention. A three dimensional shape 902 for an object 900 may be determined from a representative model for an ear and a visualization of the object 900 may be displayed with visual indicators 904 for areas to record comfort information. In some embodiments, the model for object 900 may be used to develop an actual apparatus for recording comfort information. In some embodiments, shape 902 for three dimensional shaped object 900 may be a volume encompassing any amount of negative space available for an apparatus and/or headphone part to fit within an ear. The amount of negative space may be estimated from any number of ear models for the ear.

One or more visual indicators 904 for protrusions may be overlayed onto the visualization for object 900. Actual protrusions may be coupled to an apparatus formed with model for object 900 in the same locations on an apparatus as protrusions 904 on the visualization for the object 900 to test a comfort level at corresponding locations on ear surfaces. Comfort levels may be recorded for the one or more protrusions on the surface of an ear when the apparatus is used.

Figure 9B:
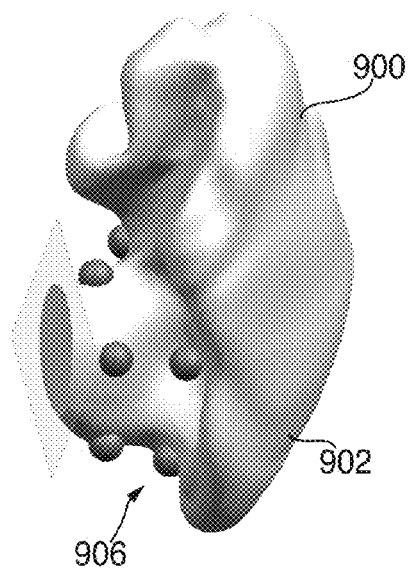
FIG. 9B is an illustrative view of an exemplary model of an object with visual indicators for recording comfort information in accordance with some embodiments of the invention.

FIG. 9B is an illustrative view of an exemplary model of an object with visual indicators for recording comfort information in accordance with some embodiments of the invention. FIG. 9B illustrates adjustments to three dimensional object 900 that may be performed. Three dimensional object shape 902 may be determined by splitting three dimensional object 900, as illustrated, with a plane 906 at any location desired. For example, three-dimensional object 900 may be split with a plane at a position within an ear canal.

Figure 9C:
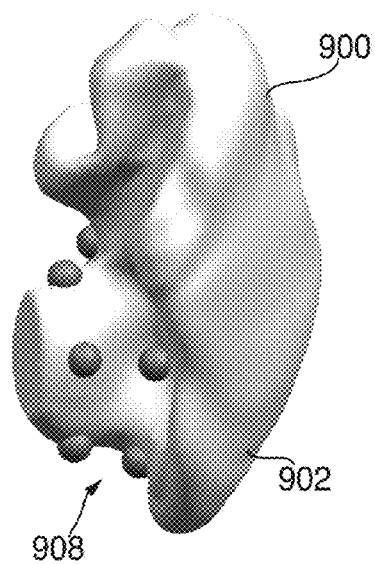
FIG. 9C is an illustrative view of an exemplary model of an object with visual indicators for recording comfort information in accordance with some embodiments of the invention.

FIG. 9C is an illustrative view of an exemplary model of an object with visual indicators for recording comfort information in accordance with some embodiments of the invention. FIG. 9C illustrates further adjustments to three-dimensional object 900 that may be performed. Edges 908 for three-dimensional object 900 may be blended (e.g., using 1 mm blend) for the model to soften the edges 908 for the resulting apparatus created using the model.

Figure 10A:
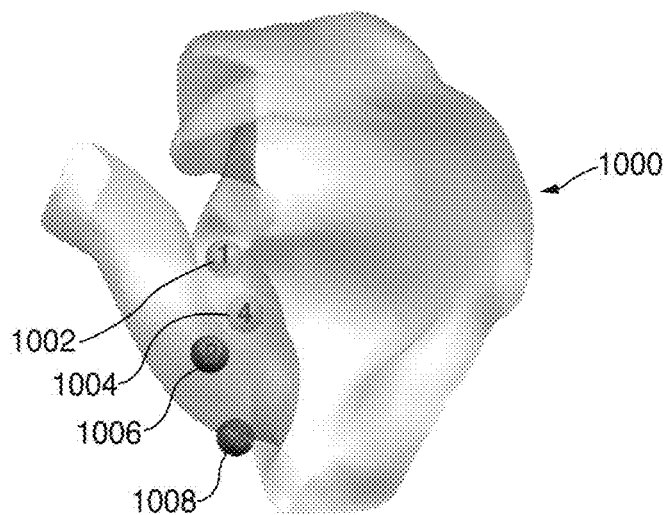
FIG. 10A is an illustrative view of an exemplary ear model with visual indicators for recorded comfort information in accordance with some embodiments of the invention.

FIG. 10A is an illustrative view of an exemplary ear model with visual indicators for recorded comfort information in accordance with some embodiments of the invention. Ear model 1000 visualization is rendered with visual indicators 1002, 1004, 1006, and 1008 overlayed onto ear model 1000 at locations on a surface of ear model 1000. Each visual indicator has a color or shading to indicate a level of comfort level experienced by a user with an apparatus 900. For example, visual indicators 1006 and 1008 have a darker color than visual indicators 1002 and 1004. When a user tests a prototype, comfort level information may be recorded and stored in a database for the prototype and the user. A visualization for an ear model for the user may be rendered and comfort level information may be retrieved so that visual indicators 1002, 1004, 1006, and 1008 may be overlayed onto the visualization to indicate comfort level information for the user's experience with the prototype.

In another embodiment, protrusions on a resulting apparatus created with object 900 may correspond to locations 1002, 1004, 1006, and 1008 on a surface of an ear where comfort level was recorded during testing with the apparatus.

Figure 10B:
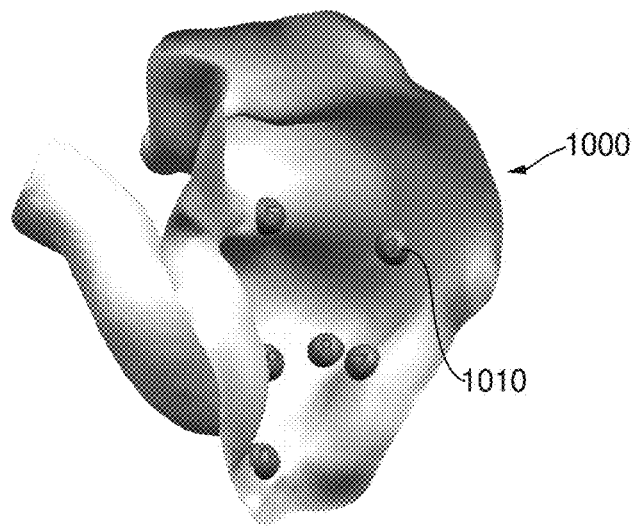
FIG. 10B is an illustrative view of an exemplary ear model with visual indicators for recorded comfort information in accordance with some embodiments of the invention.

FIG. 10B is an illustrative view of an exemplary ear model with visual indicators for recorded comfort information in accordance with some embodiments of the invention. Ear model 1000 is overlayed with visual indicators 1010 at locations on a surface of ear model 1000. Each visual indicator has a color or shading to indicate a level of comfort experienced by a user.

Figure 11:
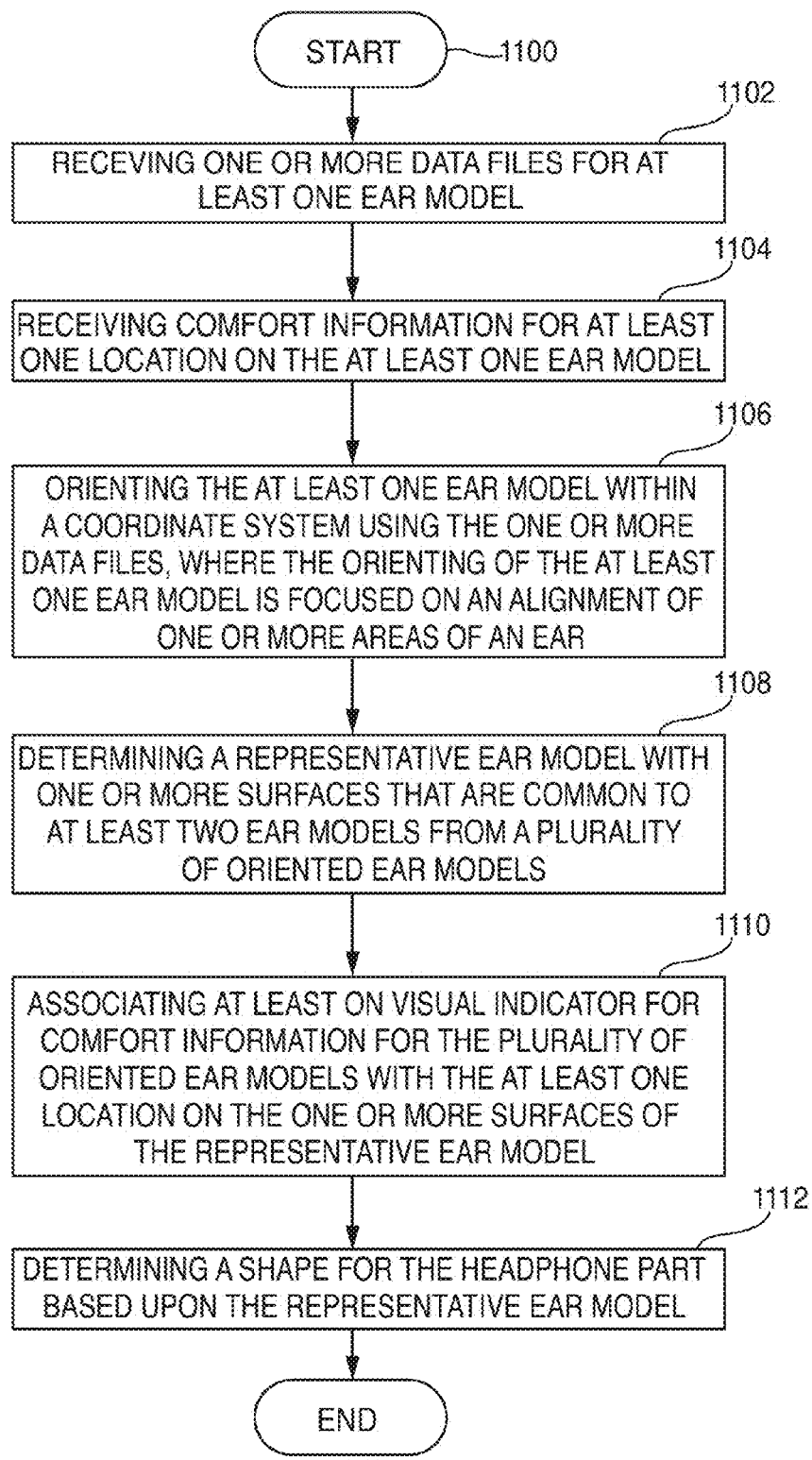
FIG. 11 is a flowchart for an exemplary method for determining a form for a headphone part using a representative ear model in accordance with some embodiments of the invention.

FIG. 11 is a flowchart for an exemplary method for determining a form for a headphone part using a representative ear model in accordance with some embodiments of the invention. Flowchart 1100 is a method for determining a form for a headphone part using a representative ear model and recorded comfort information. One or more data files for at least one ear model may be received (1102). The data files may have information on rendering the ear model on a display.

Comfort information for at least one location on the ear model may be received (1104). Comfort information may be values for a comfort level experienced by a user at locations on an ear.

The ear model may be oriented within a coordinate system using the data files (1106). Ear models may be oriented with a focus on an alignment of one or more areas of an ear. A representative ear model may be determined with one or more surfaces that are common to at least two ear models from a plurality of oriented ear models (1108). The plurality of ear models may be oriented with a focus on alignment of the same areas of the ear.

At least one visual indicator for comfort information for the plurality of oriented ear models may be associated with the location(s) on the surface(s) of the representative ear model (1110). A visual indicator for a value for comfort level for one or more ear models may be associated with a location on the representative model. An average of values for comfort level at a location on a plurality of ear models may be used for the visual indicator at the corresponding location on the representative model.

A shape may be determined for the headphone part based upon the representative ear model (1112).

Figure 12:
FIG. 12 is an exemplary chart with recorded values for comfort information in accordance with some embodiments of the invention.

FIG. 12 is an exemplary chart with recorded values for comfort information in accordance with some embodiments of the invention. Chart 1200 illustrates values for comfort level in column 1202, entitled "3 mm radius" and column 1204, entitled "6 mm radius." Each value in columns 1202 and 1204 represents a value for comfort level felt on the ear for a user with an apparatus for testing comfort level, as depicted in FIGS. 9A-9C, or a headset part prototype. In some embodiments, the "3 mm radius" and "6 mm radius" represents a radius of a spherical protrusion on an apparatus to test comfort level for an ear. In other embodiments, the "3 mm radius" and "6 mm radius" represents a radius of a protrusion on a prototype.

The values for comfort level are recorded for locations enumerated in column 1206, entitled "Location" and described at column 1208, entitled "Location Description." Any duration of time may be used to test comfort level. For example, comfort level may be recorded after an apparatus or a prototype is placed in the ear for over a minute.

Figure 13:
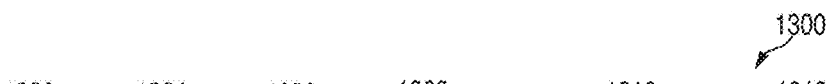
FIG. 13 is an exemplary chart with recorded values for an iterative process to design of a headphone part using a representative model in accordance with some embodiments of the invention.

FIG. 13 is an exemplary chart with recorded values for an iterative process to design a headphone part using a representative model. Chart 1300 illustrates a view of data that may be stored in any number of tables within a database. Chart 1300 has data that may be recorded and stored for later retrieval during an iterative design process for determining a form for a headphone part. A representative model may serve as a guide or a map for the available space on surfaces and within cavities for a plurality of ears. Prototypes may be designed to fit within and/or based on the representative model and then may be tested on potential users of the headphone part. Data may be recorded on user's actual experiences with the prototype and stored within a database.

As shown in chart 1300, the database may provide one or more tables storing data for the following columns: Prototype column 1302, entitled "Prototype," Person column 1304, entitled "Person," Stability column 1306, entitled "Stability," Comfort Level column 1308, entitled "Comfort Level," Activity column 1310, entitled "Activity," and Surface column 1312, entitled "Surface." As shown in row 1314, person "100" tested prototype "1" and had a stability percentage of 55% and a comfort level percentage of 80%. Testing can occur for any duration of time to test the stability and comfort level of a prototype over time, and measurements can be recorded.

Continuing with row 1314, person "100" was engaged in an activity of "running" and surface "surface 3" of prototype "1" was in contact with an ear surface of person "100." Testing can involve any type of activity, including, but not limited to: exercising, movement, exposure to different temperatures, and/or any other activity that may cause movement or affect the ear.

Surfaces of a prototype and/or surfaces of an ear that are in contact with the prototype can be recorded. In some embodiments, a prototype may be frozen or cooled to a temperature that is below the temperature of a person being tested with the prototype. An infrared imaging camera can be used to detect where the prototype comes into contact with the person being tested.

Data recorded and stored during the iterative design process may be retrieved and used to determine the form of a headphone part. Data recorded may be retrieved and used as visual indicators that may be overlayed onto a rendering of a representative model and/or an ear model. For example, comfort level information for all users of a particular prototype may be retrieved and comfort level information visual indicators for the comfort level information may be overlayed onto a rendering of oriented ear models used to create the representative model and/or overlayed onto the representative model.

Figure 14:
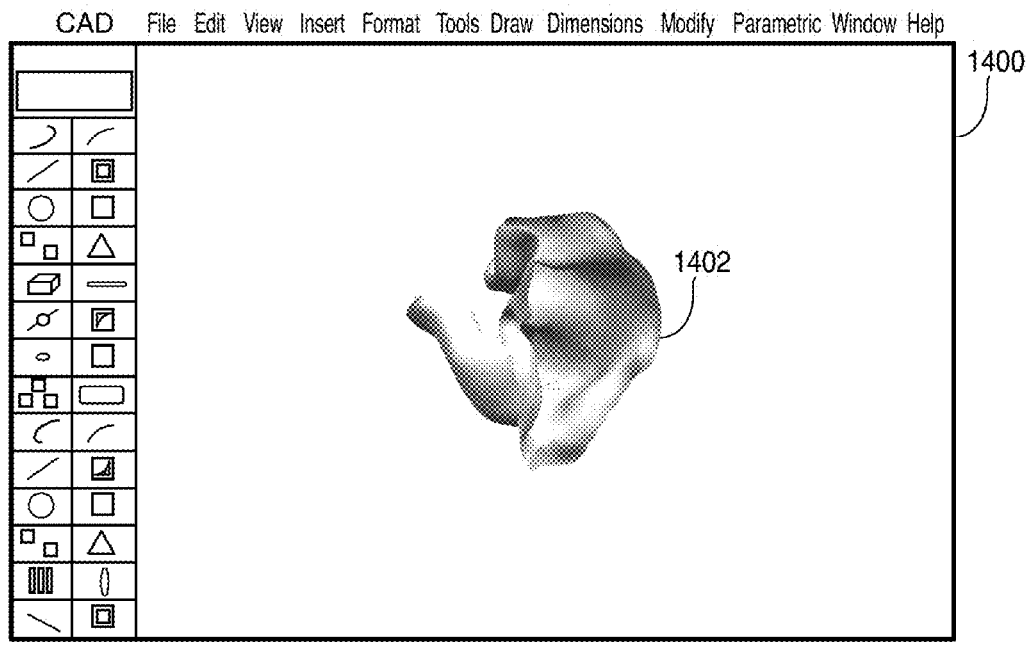
FIG. 14 is an illustrative view of an exemplary design application with renderings of a visualization of an ear model in accordance with some embodiments of the invention.

FIG. 14 is an illustrative view of an exemplary design application with a rendering of a visualization of an ear model in accordance with some embodiments of the invention. A rendering of a visualization for a first ear model 1402 is displayed within user interface 1400 for the design application.

Figure 15:
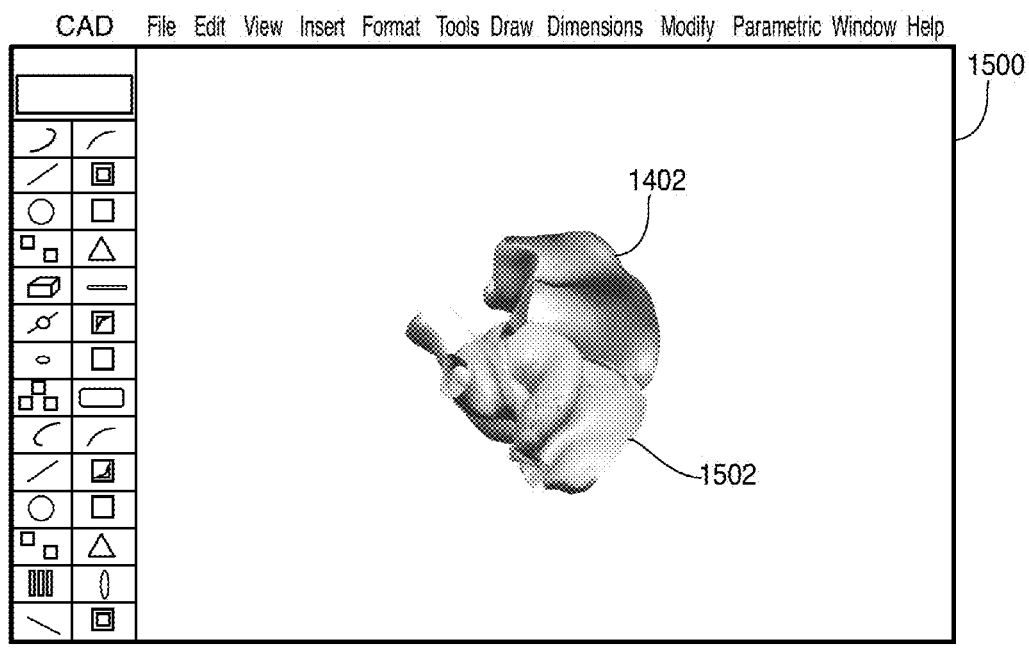
FIG. 15 is an illustrative view of an exemplary design application with renderings of visualizations for two ear models in accordance with some embodiments of the invention.

FIG. 15 is an illustrative view of an exemplary design application with renderings of visualizations for two ear models in accordance with some embodiments of the invention. A rendering of a visualization for a first ear model 1402 is displayed within user interface 1500 for the design application with a visualization for a second ear model 1502 overlayed on the first visualization 1402. A user may drag and drop the visualizations 1402 and 1502 in order to manually orient the ear model.

Figure 16:
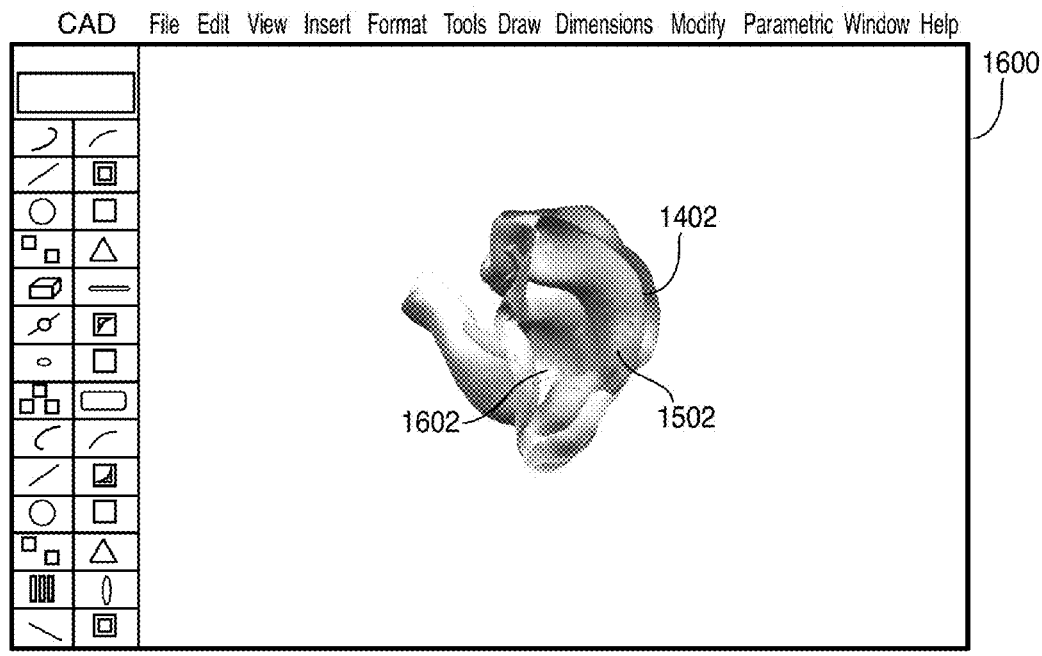
FIG. 16 is an illustrative view of an exemplary design application with renderings of visualizations for two ear models oriented on a concha in accordance with some embodiments of the invention.

FIG. 16 is an illustrative view of an exemplary design application with renderings of visualizations for two ear models oriented on a concha in accordance with some embodiments of the invention. A rendering of visualization for the first ear model 1402 is displayed within user interface 1600 for the design application with a visualization for a second ear model 1502 overlayed on the first visualization 1402. First 1402 and second visualizations 1502 are oriented with alignment focused on concha area 1602 of the ear models.

Figure 17:
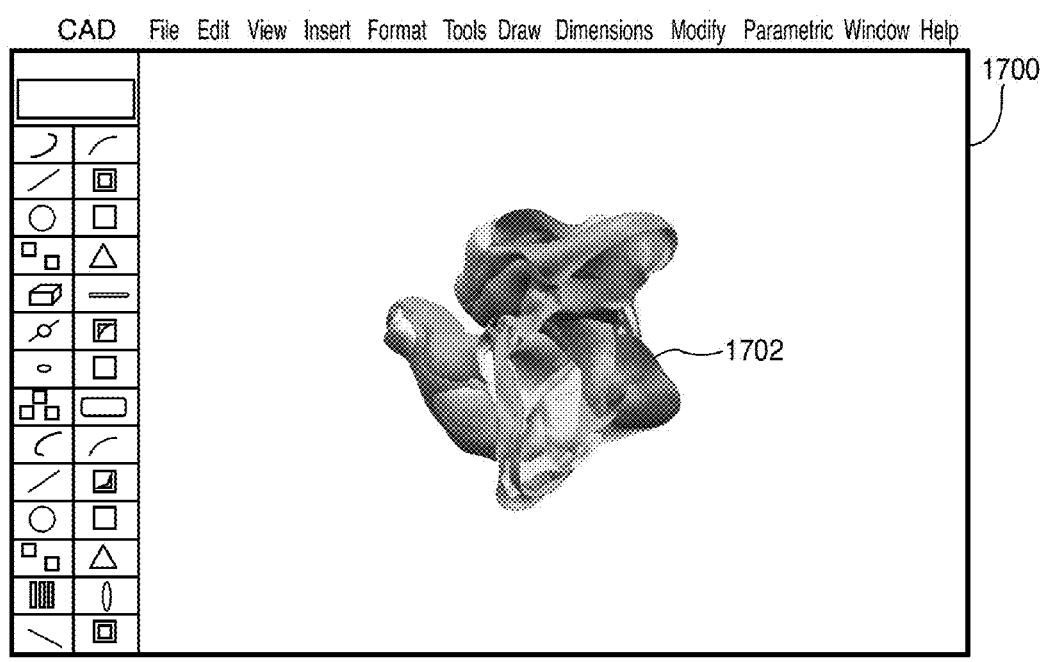
FIG. 17 is an illustrative view of an exemplary design application with renderings of visualizations for a plurality of ear models oriented on a concha in accordance with some embodiments of the invention.

FIG. 17 is an illustrative view of an exemplary design application with renderings of visualizations for a plurality of ear models oriented on a concha in accordance with some embodiments of the invention. Renderings of visualizations for a plurality of ear models 1702 are displayed within user interface 1700 for the design application and the plurality of ear models are oriented with alignment focused on the concha area.

FIG. 18A is a sagittal view of an exemplary ear with landmark points for alignment of an ear model in accordance with some embodiments of the invention. Ear 1800 has landmark points including, but not limited to, the following: Tragus 1802, Tragion 1804, Antitragus 1806, Intertragic Incisure 1808, Otobasion Superior 1810, Otobasion Inferior 1812, Superaurale 1814, Ear Breadth Outer 1816, Subaurale 1818, Ear Breadth Inner 1820, Ear Protrusion Bottom 1822, and Poiron 1824.

FIG. 18B is an axial bottom view of an exemplary ear with landmark points for alignment of an ear model in accordance with some embodiments of the invention. Ear 1800 has landmark points including, but not limited to, the following: Otobasion Inferior 1812, Ear Protrusion Bottom 1822, Subaurale 1818, Poiron 1824, and Ear Breadth Outer 1816.

FIG. 18C is an axial top view of an exemplary ear with landmark points for alignment of an ear model in accordance with some embodiments of the invention. Ear 1800 has landmark points including, but not limited to, the following: Ear Protrusion Top 1826, Superaurale 1814, and Otobasion Superior 1810.

FIG. 18D is a coronal front view of an exemplary ear with landmark points for alignment of an ear model in accordance with some embodiments of the invention. Ear 1800 has landmark points including, but not limited to, the following: Otobasion Inferior 1812, Ear Protrusion Top 1826, Otobasion Superior 1810, Ear Breadth Inner 1820, Tragion 1804, Tragus 1802, Intertragic Incisure 1808, Antitragus 1806, and Superaurale 1814.

FIG. 18E is a coronal back view of an exemplary ear with landmark points for alignment of an ear model in accordance with some embodiments of the invention. Ear 1800 has landmark points including, but not limited to, the following: Ear Protrusion Top 1826, Ear Protrusion Mid 1828, Ear Protrusion Bottom 1822, Subaurale 1818, Superaurale 1814, and Ear Breadth Outer 1816.

Figure 19A:
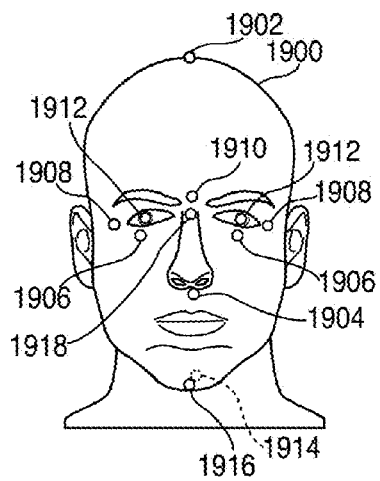
FIG. 19A is a coronal front view of an exemplary human head with landmark points for alignment of an ear model in accordance with some embodiments of the invention.

FIG. 19A is a coronal front view of an exemplary human head with landmark points for alignment of an ear model in accordance with some embodiments of the invention. Human head 1900 has landmark points including, but not limited to, the following: top of head 1902, Subnasale 1904, Orbitale(s) 1906, Ectoorbitale(s) 1908, Glabella 1910, Pupil(s) 1912, Submandibular 1914, Menton 1916, and Seillion 1918.

Figure 19B:
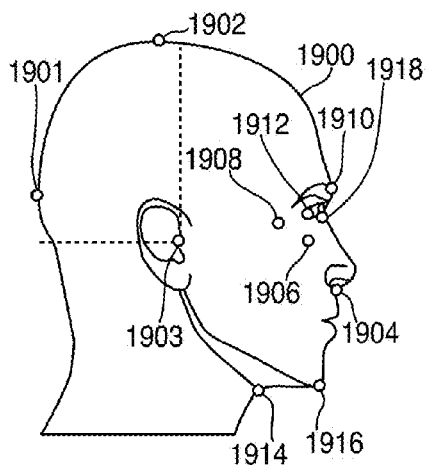
FIG. 19B is a sagittal view of an exemplary human head with landmark points for alignment of an ear model in accordance with some embodiments of the invention.

FIG. 19B is a sagittal view of an exemplary human head with landmark points for alignment of an ear model in accordance with some embodiments of the invention. Human head 1900 has landmark points including, but not limited to, the following: back of head 1901, top of head 1902, Glabella 1910, Pupil(s) 1912, Seillion 1918, Subnasale 1904, Orbitale(s) 1906, Ectoorbitale(s) 1908, Submandibular 1914, Traigon 1903, and Menton 1916.

Figure 19C:
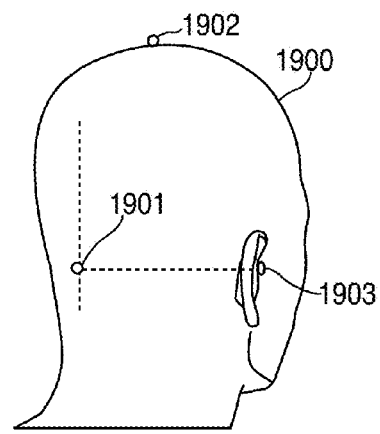
FIG. 19C is a three-quarter rear view of an exemplary human head with landmark points for alignment of an ear model in accordance with some embodiments of the invention.

FIG. 19C is an exemplary three-quarter rear view of a human head with landmark points for alignment of an ear model in accordance with some embodiments of the invention. Human head 1900 has landmark points including, but not limited to, the following: back of head 1901, top of head 1902, and Traigon 1903.

Any suitable programming language can be used to implement methods of particular embodiments, including, but not limited to, the following: C, C++, Java, assembly language, etc. Those with skill in the art will recognize that different programming techniques can be employed to implement particular embodiments, such as procedural or object oriented. The methods or routines can execute on a single processing device or on multiple processors.

Although the steps, operations, or computations may be presented in a specific order, the order may be altered for one or more embodiments. In some embodiments, multiple steps shown as sequential in this specification can be performed at the same time or in-parallel.

Particular embodiments may be implemented in a computer-readable storage device for use by or in connection with an instruction execution system, apparatus, system, or device. Particular embodiments can be implemented in the form of control logic in software or hardware or a combination of both. The control logic, when executed by one or more processors, may be operable to perform that which is described in particular embodiments.

Particular embodiments may be implemented by using a programmed general purpose digital computer, application specific integrated circuits, programmable logic devices, field programmable gate arrays, optical, chemical, biological, quantum or nanoengineered systems, components and mechanisms may be used. In general, the methods or functions of particular embodiments can be achieved by any means as is known in the art. Distributed, networked systems, components, and/or circuits can be used. Communication, or transfer, of data may be wired, wireless, or by any other means.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope to implement a program or code that can be stored in a machine-readable medium, such as a storage device, to permit a computer to perform any of the methods described above.

The above described embodiments of the present invention are presented for purposes of illustration and not of limitation, and the present invention is limited only by the claims.

What is claimed is:

1. A method for determining a form for a headphone part, the method comprising:
receiving data representing at least one ear model;
using a data processing device, orienting the at least one ear model within a coordinate system using the data, wherein orienting the at least one ear model is based at least in part on alignment with respect to at least one area of an ear;
using the data processing device, determining a representative model from a plurality of oriented ear models including the at least one oriented ear model, the representative model representing a volume of space common to at least two of the oriented ear models;
determining at least one of a size and shape of the headphone part based on the representative model;
receiving comfort level data for the at least one ear model, wherein the comfort level data is obtainable from prototype testing and indicates a level of comfort associated with at least one location on a surface of an ear;
rendering a visualization for the representative model within a computer aided design application; and
overlaying the visualization with visual indicators based on the comfort level data for the oriented ear models.

2. The method of claim 1, wherein the volume of space is a volume of negative space.

3. The method of claim 1, wherein the data representing at least one ear model includes information for rendering a visualization of the at least one ear model on a display.

4. The method of claim 3, wherein the visualization of the at least one ear model is a three-dimensional visualization generated using the computer aided design application.

5. The method of claim 1, wherein orienting the at least one ear model comprises:
- mating a first area of the ear to an origin of the coordinate system;
- mating a second area of the ear to an x-axis of the coordinate system; and
- mating a third area of the ear to an x-z plane of the coordinate system.

6. The method of claim 5, wherein the first area of the ear is a tip of a tragus on a surface of the ear, the second area of the ear is a tip of an antitragus on the surface of the ear, and the third area is a midpoint between the tragus and the antitragus.

7. The method of claim 1, wherein orienting the at least one ear model comprises mating a tip of a tragus on a surface of the ear to an origin of the coordinate system, mating an inflection point of a meatus on the surface of the ear to a y-axis, and mating an intersection of an inferior crus of an antihelix and a crus of a helix to a y-z plane.

8. The method of claim 1, further comprising:
- overlaying the visualization for the representative model with other visual indicators of a topography of a surface formed by the oriented ear models.

9. The method of claim 1, wherein the volume of space is an estimate for a volume solid formed by the oriented ear models within the coordinate system.

10. The method of claim 1, wherein the visualization is overlayed with a heat map to display the comfort level data.

11. A method for determining a form for a headphone part using a prototype part, comprising:
- rendering a first visualization for a first ear model on a display;
- using a data processing device, orienting the first visualization within a coordinate system displayed on the display;
- rendering a second visualization for a second ear model on the display;
- using the data processing device, orienting the second visualization within the coordinate system such that the second visualization overlays the first visualization;
- using the data processing device, determining a representative model from the oriented first and second ear models; and
- determining at least one of a size and shape for the headphone part based on the representative model, wherein:
  - the first visualization comprises visualization of first comfort level data for the first ear model;
  - the first comfort level data indicates at least one level of comfort of a first ear associated with the first ear model when wearing the prototype part;
  - the second visualization comprises visualization of second comfort level data for the second ear model; and
  - the second comfort level data indicates at least one level of comfort of a second ear associated with the second ear model when wearing the prototype part.

12. The method of claim 11, wherein the representative model is a volume of negative space common to the oriented first and second ear models.

13. The method of claim 11, wherein orienting the first and second visualizations is based at least in part on alignment with respect to at least one area of an ear.

14. A method for determining a form for a headphone part using a three-dimensional object, the method comprising:
- receiving at least one data file for at least one ear model, wherein the at least one data file comprises information on rendering the at least one ear model on a display;
- receiving comfort level information for at least one location on the at least one ear model, wherein the comfort level information comprises at least one value for comfort level for the at least one location of an ear associated with the at least one ear model when wearing the three-dimensional object;
- using a data processing device, orienting the at least one ear model within a coordinate system using the at least one data file, wherein orienting the at least one ear model is based at least in part on alignment with respect to at least one area of an ear;
- using the data processing device, determining a representative model having at least one surface common to at least two ear models of a plurality of oriented ear models including the oriented at least one ear model;
- associating at least one visual indicator for comfort information for the plurality of oriented ear models with the at least one location on the at least one surface of the representative model;
- rendering a visualization for the representative model on the display;
- displaying visual indicators for the comfort level information for the plurality of oriented ear models on the at least one surface of the rendered visualization for the representative model; and
- determining a shape for the headphone part based on the rendered visualization for the representative model and the visual indicators.

15. The method of claim 14,
wherein the visual indicators comprise a heat map indicating the comfort level information for the plurality of oriented ear models.

16. The method of claim 14, wherein the comfort level information for the plurality of oriented ear models for the at least one location is an average of values for comfort level at the at least one location for each of the plurality of ear models.

17. The method of claim 14, wherein receiving comfort level information for at least one location on the at least one ear model includes:
- cooling at least one protrusion of the three-dimensional object insertable into the ear of a user; and
- when the object is inserted into the ear at the at least one location, recording the comfort level information received for the user with respect to the at least one protrusion.

* * * * *